(12) United States Patent
Choy et al.

(10) Patent No.: US 9,450,561 B2
(45) Date of Patent: Sep. 20, 2016

(54) BULK ACOUSTIC WAVE (BAW) RESONATOR STRUCTURE HAVING AN ELECTRODE WITH A CANTILEVERED PORTION AND A PIEZOELECTRIC LAYER WITH VARYING AMOUNTS OF DOPANT

(71) Applicant: Avago Technologies General IP (Singapore) Pte. Ltd., Singapore (SG)

(72) Inventors: John Choy, Westminster, CO (US); Chris Feng, Fort Collins, CO (US); Phil Nikkel, Loveland, CO (US); Kevin Grannen, Thornton, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 88 days.

(21) Appl. No.: 14/069,321

(22) Filed: Oct. 31, 2013

(65) Prior Publication Data

US 2014/0125203 A1 May 8, 2014

Related U.S. Application Data

(63) Continuation-in-part of application No. 12/626,035, filed on Nov. 25, 2009, now Pat. No. 8,902,023, and a continuation-in-part of application No. 13/906,873, filed on May 31, 2013, now abandoned.

(51) Int. Cl.
*H03H 9/13* (2006.01)
*H03H 9/17* (2006.01)
*H03H 9/02* (2006.01)

(52) U.S. Cl.
CPC ...... *H03H 9/02015* (2013.01); *H03H 9/02118* (2013.01); *H03H 9/02149* (2013.01); *H03H 9/132* (2013.01); *H03H 9/173* (2013.01); *H03H 9/175* (2013.01)

(58) Field of Classification Search
CPC ........... H03H 9/0211; H03H 9/02118; H03H 9/02133; H03H 9/02149; H03H 9/132; H03H 9/173; H03H 9/175; H03H 9/02015

USPC .......................... 333/187, 189; 310/365, 312
See application file for complete search history.

(56) References Cited

U.S. PATENT DOCUMENTS 5,162,691 A 11/1992 Mariani et al.
5,587,620 A 12/1996 Ruby et al.
(Continued)

FOREIGN PATENT DOCUMENTS

CN 101170303 9/2011
DE 102007012384 9/2008
(Continued)

OTHER PUBLICATIONS

Allaha, "Solidly Mounted BAW Resonators With Layer-Transferred AIN Using Sacrificial Si Surfaces", Solid State Electronics, ESSDERC 2009 Conference, vol. 54, Issue 9, Sep. 2010, abstract and drawings with captions only, 5 pages.
Dubois, "Solidl Mounted Resonator Based on Aluminum Nitride Thin Film", 1998 IEEE Ultrasonics Symposium, vol. 1, 1998, 909-912.
Strijbos, "Design and Characterisation of High-Q Solidly-Mounted Bulk Acoustic Wave Filters", ECTC '07. Proceedings. 57th Electronic Components and Technology Conference, Publication Year 2007, 169-174.
(Continued)

*Primary Examiner* — Barbara Summons

(57) ABSTRACT

A bulk acoustic wave (BAW) resonator, comprises: a first electrode; a second electrode comprising a plurality of sides. At least one of the sides comprises a cantilevered portion. The bulk acoustic wave (BAW) resonator also comprises a piezoelectric layer disposed between the first and second electrodes. The piezoelectric layer comprises an undoped piezoelectric material and a doped piezoelectric material, and the cantilevered portion extends above the piezoelectric layer. The bulk acoustic wave (BAW) resonator comprises a gap between the cantilevered portion and the piezoelectric layer.

38 Claims, 15 Drawing Sheets

(56) References Cited

U.S. PATENT DOCUMENTS

| | | | |
|---|---|---|---|
| 5,873,153 | A | 2/1999 | Ruby et al. |
| 5,910,756 | A | 6/1999 | Ella |
| 6,107,721 | A | 8/2000 | Lakin |
| 6,215,375 | B1 | 4/2001 | Larson, III et al. |
| 6,262,637 | B1 | 7/2001 | Bradley et al. |
| 6,384,697 | B1 | 5/2002 | Ruby |
| 6,441,539 | B1 | 8/2002 | Kitamura |
| 6,507,983 | B1 | 1/2003 | Ruby et al. |
| 6,583,688 | B2 | 6/2003 | Klee et al. |
| 6,709,776 | B2 | 3/2004 | Noguchi et al. |
| 6,828,713 | B2 | 12/2004 | Bradley et al. |
| 6,849,475 | B2 | 2/2005 | Kim |
| 6,936,837 | B2 | 8/2005 | Yamada et al. |
| 7,002,437 | B2 | 2/2006 | Takeuchi et al. |
| 7,109,826 | B2 | 9/2006 | Ginsburg et al. |
| 7,129,806 | B2 | 10/2006 | Sato |
| 7,233,218 | B2 | 6/2007 | Park et al. |
| 7,268,647 | B2 | 9/2007 | Sano |
| 7,275,292 | B2 | 10/2007 | Ruby et al. |
| 7,280,007 | B2 | 10/2007 | Feng et al. |
| 7,281,304 | B2 | 10/2007 | Kim et al. |
| 7,358,831 | B2 | 4/2008 | Larson, III et al. |
| 7,388,454 | B2 | 6/2008 | Ruby et al. |
| 7,468,608 | B2 | 12/2008 | Feucht et al. |
| 7,482,737 | B2 | 1/2009 | Yamada et al. |
| 7,567,023 | B2 | 7/2009 | Iwaki et al. |
| 7,575,292 | B2 | 8/2009 | Furukawa |
| 7,602,101 | B2 | 10/2009 | Hara et al. |
| 7,629,865 | B2 | 12/2009 | Ruby |
| 7,714,684 | B2 | 5/2010 | Ruby et al. |
| 7,737,807 | B2 | 6/2010 | Larson et al. |
| 7,758,979 | B2 | 7/2010 | Akiyama et al. |
| 7,791,434 | B2 | 9/2010 | Fazzio et al. |
| 7,966,722 | B2 | 6/2011 | Hart et al. |
| 8,008,993 | B2 | 8/2011 | Milsom et al. |
| 8,084,919 | B2 | 12/2011 | Nishihara et al. |
| 8,248,185 | B2 | 8/2012 | Choy et al. |
| 8,384,497 | B2 | 2/2013 | Zhang |
| 8,902,023 | B2 | 12/2014 | Choy et al. |
| 2002/0158716 | A1 | 10/2002 | Pensala |
| 2003/0227357 | A1 | 12/2003 | Metzger et al. |
| 2005/0057324 | A1 | 3/2005 | Onishi et al. |
| 2005/0248232 | A1 | 11/2005 | Itaya et al. |
| 2005/0269904 | A1 | 12/2005 | Oka |
| 2006/0038636 | A1 | 2/2006 | Tsurumi et al. |
| 2006/0132262 | A1 | 6/2006 | Fazzio et al. |
| 2006/0226932 | A1 | 10/2006 | Fazzio et al. |
| 2007/0037311 | A1 | 2/2007 | Izumi et al. |
| 2007/0205850 | A1 | 9/2007 | Jamneala et al. |
| 2007/0247260 | A1 | 10/2007 | Yanase et al. |
| 2007/0252476 | A1 | 11/2007 | Iwaki et al. |
| 2007/0279153 | A1 | 12/2007 | Ruby |
| 2008/0024042 | A1 | 1/2008 | Isobe et al. |
| 2008/0129414 | A1 | 6/2008 | Lobl et al. |
| 2008/0129417 | A1 | 6/2008 | Taniguchi |
| 2008/0143215 | A1 | 6/2008 | Hara et al. |
| 2008/0258842 | A1 | 10/2008 | Ruby et al. |
| 2009/0079302 | A1 | 3/2009 | Wall et al. |
| 2009/0127978 | A1 | 5/2009 | Asai et al. |
| 2009/0267453 | A1 | 10/2009 | Barber et al. |
| 2009/0267457 | A1 | 10/2009 | Barber et al. |
| 2010/0033063 | A1 | 2/2010 | Nishihara et al. |
| 2010/0107389 | A1 | 5/2010 | Nessler et al. |
| 2010/0187948 | A1 | 7/2010 | Sinha et al. |
| 2010/0327697 | A1 | 12/2010 | Choy et al. |
| 2010/0327994 | A1 | 12/2010 | Choy et al. |
| 2011/0084779 | A1 | 4/2011 | Zhang |
| 2011/0148547 | A1 | 6/2011 | Zhang |
| 2011/0180391 | A1 | 7/2011 | Larson, III et al. |
| 2012/0154074 | A1 | 6/2012 | Ruby et al. |
| 2012/0161902 | A1 | 6/2012 | Feng et al. |
| 2012/0194297 | A1 | 8/2012 | Choy et al. |
| 2012/0218055 | A1 | 8/2012 | Burak et al. |
| 2012/0218056 | A1 | 8/2012 | Burak |
| 2012/0218057 | A1 | 8/2012 | Burak et al. |
| 2012/0218058 | A1 | 8/2012 | Burak et al. |
| 2012/0218059 | A1 | 8/2012 | Burak et al. |
| 2012/0218060 | A1 | 8/2012 | Burak et al. |
| 2012/0248941 | A1 | 10/2012 | Shirakawa et al. |
| 2012/0280767 | A1 | 11/2012 | Burak et al. |
| 2013/0127300 | A1 | 5/2013 | Umeda et al. |
| 2013/0241673 | A1* | 9/2013 | Yokoyama ......... H03H 9/02015 333/189 |

FOREIGN PATENT DOCUMENTS

| | | |
|---|---|---|
| EP | 2299592 | 3/2011 |
| FR | 2951027 | 4/2011 |
| JP | 1-157108 | 6/1989 |
| JP | 2006-20277 | * 1/2006 |
| JP | 2006-186412 | 7/2006 |
| JP | 2007-295306 | 11/2007 |
| JP | 2008-066792 | 3/2008 |
| JP | 2008-131194 | 6/2008 |

OTHER PUBLICATIONS

Ranjan et al "Strained Hexagonal ScN: A Material with Unusual Structural and Optical Properties," Physical Review Letters, Jun. 27, 2003, vol. 90, No. 25, The American Physical Society, USA, 4 pages.

Farrer et al., "Properties of hexagonal ScN versus wurtzite GaN and InN," Physical Review B, Nov. 20, 2002, vol. 66, No. 20, The American Physical Society, USA, 4 pages.

Constantin et al., "Composition-dependent structural properties in ScGaN alloy films: A combined experimental and theoretical study," Journal of Applied Physics, Dec. 16, 2005, vol. 98, No. 12, American Institute of Physics, USA, 8 pages.

Yanagitani et al., "Giant shear mode electromechanical coupling coefficient k12 in c-axis tilted ScAlN films," IEEE Ultrasonics Symposium (IUS), 2010, 4 pages.

Akiyama, et al., "Enhancement of piezoelectric response in scandium aluminum nitride alloy thin films prepared by dual reactive cosputtering", Advanced Materials, vol. 21, 2009, 593-596.

Akiyama, et al., "Preparation of scandium aluminum nitride thin films by using scandium aluminum alloy sputtering target and design of experiments", Journal of the Ceramic Society of Japan, 118, [12], 2010, 1166-1169.

Moreira, et al., "Aluminum scandium nitride thin-film bulk acoustic resonators for wide band applications", Vacuum, vol. 86, Issue 1, Jul. 4, 2011, 23-26.

Suzuki, et al., "Influence of shadowing effect on shear mode acoustic properties in the c-axis tilted AlN films", IEEE International Ultrasonics Symposium, 2010, 1478-1481.

Zhou, et al., "Energetics and electronic structures of AlN nanotubes/wires and their potential application as ammonia sensors", Nanotechnology 18 (2007) 424023, published Sep. 19, 2007, pp. 1-7, and one page IP address.

Al-Ahmad, et al. "Piezoelectric-Based Tunable Microstrip Shunt Resonator", Proceedings of the Asia-Pacific Microwave Conference 2006, IEICE, 4 pages.

Machine translation of JP2006-186412, published Jul. 13, 2006.
Machine translation of JP2008-131194, published Jun. 5, 2008.
Machine translation of JP2008-066792, published Mar. 21, 2008.
Office Action mailed Aug. 28, 2015 in Chinese Patent Application No. 201210581765.X.

IEEE Xplore Abstract for "Reactive Magnetron Sputtering of Piezoelectric Cr-doped AlN Thin Films", published in 2011 IEEE International Ultrasonics Symposium, Oct. 18-21, 2011, 1 page.

Response and amended claims filed in Chinese Application No. 201210581765.X, Jan. 2016 (Unofficial/non-certified translation provided by foreign agent included).

English language machine translation of JP 2006-20277, published Jan. 19, 2006, 12 pages.

Unofficial/non-certified translation of Office Action mailed Aug. 28, 2015 in Chinese Patent Application No. 201210581765.X (provided by foreign agent).

* cited by examiner

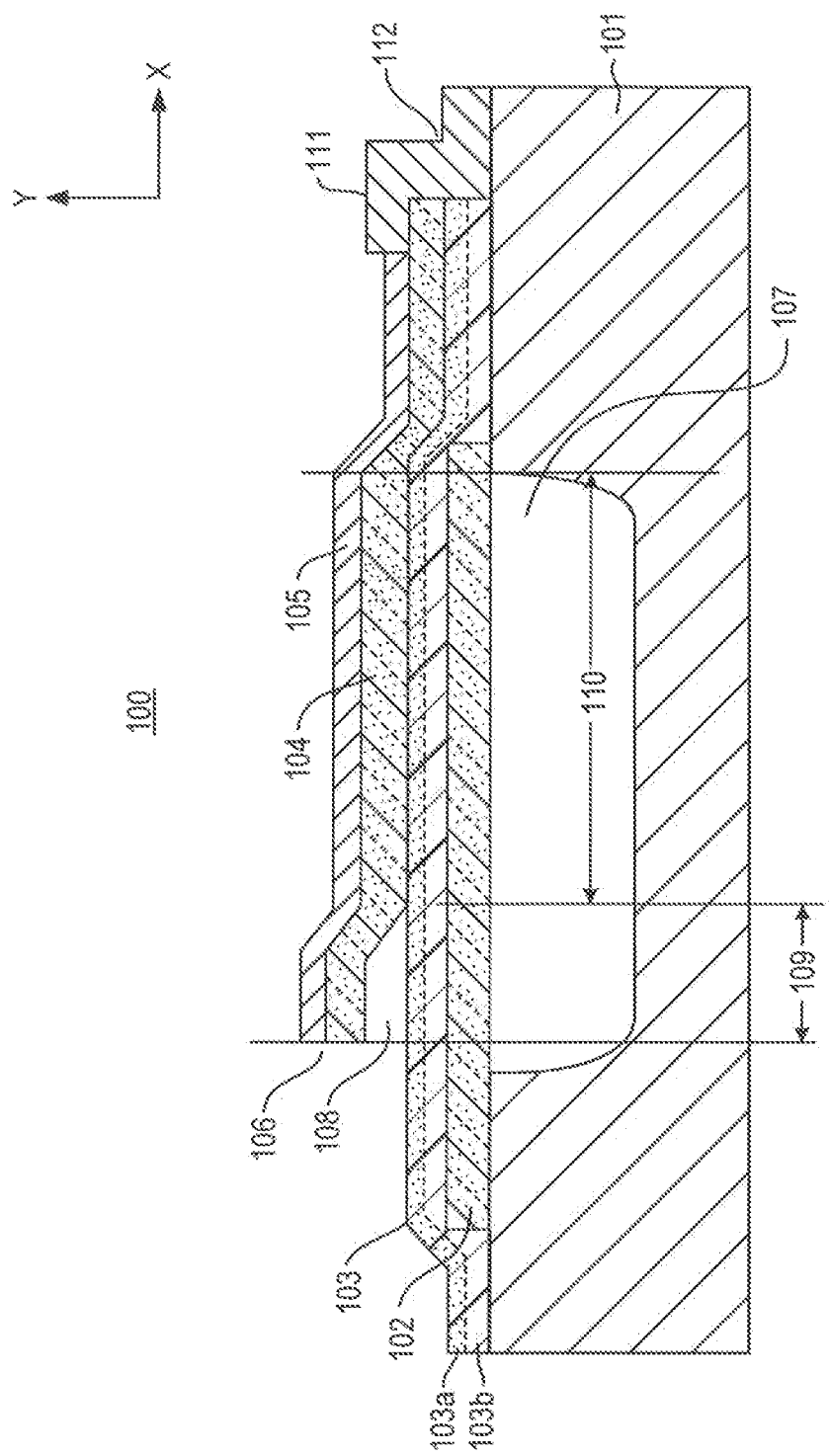

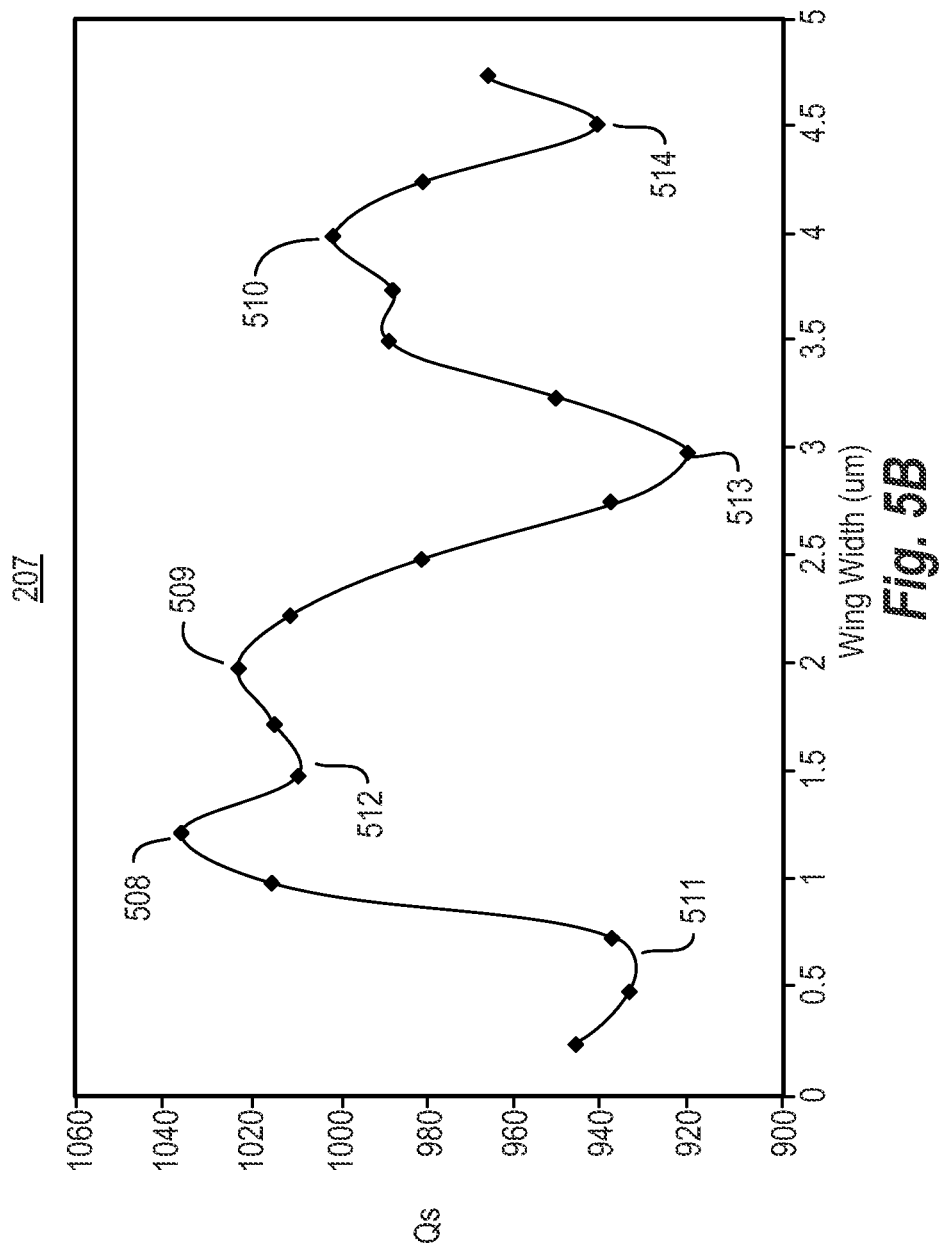

BULK ACOUSTIC WAVE (BAW) RESONATOR STRUCTURE HAVING AN ELECTRODE WITH A CANTILEVERED PORTION AND A PIEZOELECTRIC LAYER WITH VARYING AMOUNTS OF DOPANT

CROSS-REFERENCE TO RELATED APPLICATIONS

The present application is a continuation-in-part of and claims priority under 35 U.S.C. §120 from U.S. patent application Ser. No. 12/626,035 entitled "ACOUSTIC RESONATOR STRUCTURE HAVING AN ELECTRODE WITH A CANTILEVERED PORTION" to John Choy, et al. and filed on Nov. 25, 2009. The present application is also a continuation-in-part of and claims priority under 35 U.S.C. §120 from U.S. patent application Ser. No. 13/906,873 entitled "BULK ACOUSTIC WAVE RESONATOR HAVING PIEZOELECTRIC LAYER WITH VARYING AMOUNTS OF DOPANT" to John Choy, et al. and filed on May 31, 2013. The disclosures of these parent applications are specifically incorporated herein by reference.

BACKGROUND

In many electronic applications, electrical resonators are used. For example, in many wireless communications devices, radio frequency (rf) and microwave frequency resonators are used as filters to improve reception and transmission of signals. Filters typically include inductors and capacitors, and more recently resonators.

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a bulk acoustic wave (BAW) resonator. Typically, there are two types of BAW resonators: a Film Bulk Acoustic Resonator (FBAR) and a solidly mounted bulk acoustic resonator (SMR). Both the FBAR and the SMR comprise acoustic stacks that are disposed over a reflective element. The reflective element of an FBAR is a cavity, normally in a substrate over which the acoustic stack is mounted. The reflective element of an SMR is a Bragg reflector comprising alternating layers of high acoustic impedance and low acoustic impedance layers.

BAW resonators have the advantage of small size and lends itself to Integrated Circuit (IC) manufacturing tools and techniques. The FBAR includes an acoustic stack comprising, inter alia, a layer of piezoelectric material disposed between two electrodes. Acoustic waves achieve resonance across the acoustic stack, with the resonant frequency of the waves being determined by the materials in the acoustic stack.

Desirably, the BAW resonator excites only thickness-extensional (TE) modes, which are longitudinal mechanical waves having propagation (k) vectors in the direction of propagation. The TE modes desirably travel in the direction of the thickness (e.g., z-direction) of the piezoelectric layer.

Unfortunately, in addition to the desired TE modes there are lateral modes, known as Rayleigh-Lamb modes, generated in the acoustic stack as well. The Rayleigh-Lamb modes are mechanical waves having k-vectors that are perpendicular to the direction of TE modes, the desired modes of operation. These lateral modes travel in the areal dimensions (x, y directions of the present example) of the piezoelectric material. Among other adverse effects, lateral modes deleteriously impact the quality (Q) factor of an FBAR device. In particular, the energy of Rayleigh-Lamb modes is lost at the interfaces of the FBAR device. As will be appreciated, this loss of energy to spurious modes is a loss in energy of desired longitudinal modes, and ultimately a degradation of the Q-factor.

Generally, a bulk acoustic wave (BAW) resonator has a layer of piezoelectric material between two conductive plates (electrodes), which may be formed on a thin membrane. The piezoelectric material may be a thin film of various materials, such as aluminum nitride (AlN), zinc oxide (ZnO), or lead zirconate titanate (PZT), for example. Thin films made of AlN are advantageous since they generally maintain piezoelectric properties at high temperature (e.g., above 400° C.). However, AlN has a lower piezoelectric coefficient $d_{33}$ than both ZnO and PZT, for example.

An AlN thin film may be deposited with various specific crystal orientations, including a wurtzite (0001) B4 structure, which consists of a hexagonal crystal structure with alternating layers of aluminum (Al) and nitrogen (N), and a zincblende structure, which consists of a symmetric structure of Al and N atoms, for example. Due to the nature of the Al—N bonding in the wurtzite structure, electric field polarization is present in the AlN crystal, resulting in the piezoelectric properties of the AlN thin film. To exploit this polarization and the corresponding piezoelectric effect, one must synthesize the AlN with a specific crystal orientation. Generally, a higher piezoelectric coupling coefficient ($d_{33}$) is desirable, since the higher the piezoelectric coefficient $d_{33}$, the less material is required to provide the same piezoelectric effect.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1A shows a cross-sectional view of a bulk acoustic wave (BAW) resonator in accordance with a representative embodiment.

FIG. 5B shows a graph of the Q-factor at series resonance ($Q_s$) versus width of the cantilevered portion(s) of a bulk acoustic wave (BAW) resonator in accordance with a representative embodiment.

DEFINED TERMINOLOGY

Figure 1B:
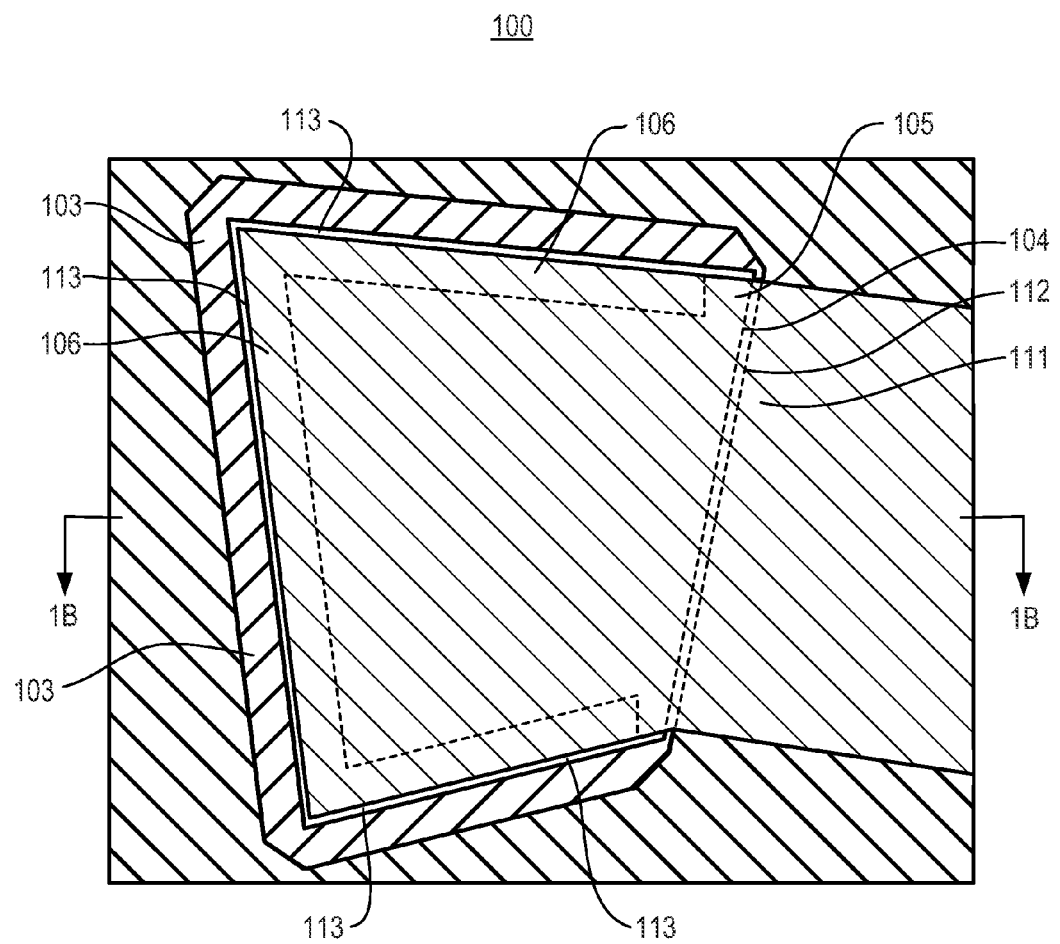
FIG. 1B shows a top view of a bulk acoustic wave (BAW) resonator in accordance with a representative embodiment.

It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

DETAILED DESCRIPTION

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparati are clearly within the scope of the present teachings.

Generally, it is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Various embodiments relate to providing a thin film of piezoelectric material (piezoelectric layer), such as AlN, with an enhanced piezoelectric coefficient $d_{33}$ and an enhanced electromechanical coupling coefficient $kt^2$ by incorporating one or more rare earth elements into the crystal lattice of a portion of the piezoelectric layer. That is, the piezoelectric layer may include multiple sub-layers, where at least one sub-layer is formed of stoichiometric AlN material (undoped AlN sub-layer) and at least one other sub-layer is formed of AlN material doped with a rare earth element (doped AlN sub-layer). Alternatively, the piezoelectric layer may be a single layer including different (e.g., graduated) levels of doping throughout the thickness of the piezoelectric layer. For example, the atomic percentage of a rare earth element may gradually change over the thickness of the piezoelectric layer. For example, the piezoelectric layer may include undoped AlN material at the bottom with gradually increasing atomic percentages of a rare earth element being added over the thickness of the piezoelectric layer. By incorporating specific atomic percentages of the multiple rare earth elements, the piezoelectric properties of the AlN, including piezoelectric coefficient $d_{33}$ and enhanced electromechanical effective coupling coefficient $kt^2$, are improved as compared to entirely stoichiometric (undoped) AlN. Also, presence of the undoped portion of the piezoelectric layer provides mechanical stability, preventing bowing.

As mentioned above, AlN material may be doped with scandium (Sc), for example, creating an AlScN compound with a predetermined atomic percentage of Sc. The Sc atom has an atomic radius that is larger than the atomic radius of the Al atom, resulting in an Sc—N bond length (2.25 Å) that is greater than the Al—N bond length (1.90 Å). This difference in bond lengths causes stress in the resulting AlScN material.

Also, a thin film of piezoelectric material, such as AlN, deposited on a substrate (e.g., forming a piezoelectric layer) may be in a tensile state of stress or a compressive state of stress. The stress state of the thin film is determined, in part, by deposition conditions and the substrate. For example, applying a negative potential to the substrate results in positive ions from the plasma bombarding the growing film, causing the film to exhibit compressive stress. This compressive stress arises from the "peening" effect of the bombarding ions.

FIG. 1A is a cross-sectional view along the line 1B-1B of a bulk acoustic wave (BAW) resonator 100 in accordance with a representative embodiment. Illustratively, the bulk acoustic wave (BAW) resonator 100 comprises an FBAR. The bulk acoustic wave (BAW) resonator 100 comprises a substrate 101, a first electrode 102 disposed beneath a piezoelectric layer 103, which comprises a first surface in contact with a first electrode 102 and a second surface in contact with a second electrode 104.

The piezoelectric layer 103 comprises two or more sub-layers of undoped and/or doped piezoelectric materials, in accordance with a representative embodiment. In other representative embodiments described below, the piezoelectric layer 103 comprises a single layer having varying amounts of dopants within the piezoelectric material, in accordance with another representative embodiment.

In the presently described representative embodiment, the piezoelectric layer 103 is a combination of undoped piezoelectric material and doped piezoelectric material, where the doped piezoelectric material may be doped with at least one rare earth element. Combining the undoped and doped piezoelectric material improves piezoelectric properties of the piezoelectric layer 103, such as increasing the coupling coefficient $kt^2$ over that of an entirely undoped piezoelectric material. At the same time, the undoped and doped piezoelectric material reduces and more evenly distributes stress in the piezoelectric layer 130, thereby reducing total compressive stress and more evenly distributing compressive stress over the substrate 101.

In the depicted embodiment, the piezoelectric layer 103 includes first sub-layer 103A and second sub-layer 103B, stacked in this order on the first electrode 102. The first and second sub-layers 103A and 103B are formed in separate processing steps to collectively provide the piezoelectric layer 103. The first sub-layer 103A is formed of undoped piezoelectric material, such as standard stoichiometric AlN, while the second sub-layer 103B is formed of doped piezoelectric material, such as AlN doped with at least one of Sc or Y, for example. Alternatively, the first sub-layer 103A may be formed of the doped piezoelectric material and the second sub-layer 103B may be formed of the undoped piezoelectric material. Of course, other piezoelectric materials and/or other rare earth elements or combinations of two or more rare earth elements may be incorporated in the first and second sub-layers 103A and 103B, without departing from the scope of the present teachings. Generally, the stress state of each of the first and second sub-layers 103A and 103B may be "tuned" to result in the overall acoustic stack 310 having a stress level compatible with other manufacturing steps, as well as having an acceptable cross wafer stress value, e.g., as discussed below with regard to Table 1. In addition, the thickness of each the first and second sub-layers 103A and 103B may be varied to provide a desired coupling coefficient $kt^2$.

According to various embodiments, the piezoelectric layer 103 may have a total layer thickness of approximately 5000 Å to approximately 25000 Å, and each of the first and second sub-layers 103A and 103B may constitute about half the total thickness, thus having a sub-layer thickness of approximately 2500 Å to approximately 12500 Å, for example. The respective thicknesses of the first and second sub-layers 103A and 103B may vary to any proportions, resulting in different properties. For example, assuming that the first sub-layer 103A is formed of undoped piezoelectric material and the second sub-layer 103B is formed of doped piezoelectric material, when the first sub-layer 103A is thicker than the second sub-layer 103B (e.g., 75 percent first sub-layer 103A and 25 percent second sub-layer 103B), the resulting piezoelectric layer 103 generally has lower and more evenly distributed compressive stress, but has less improvement in coupling coefficient $kt^2$ over a piezoelectric layer formed entirely of undoped piezoelectric material. In comparison, when the first sub-layer 103A is thinner than the second sub-layer 103B (e.g., 25 percent of the thickness being first sub-layer 103A and 75 percent being second sub-layer 103B), the resulting piezoelectric layer 103 experiences greater improvement in coupling coefficient $kt^2$, but has higher and less evenly distributed compressive stress.

Likewise, according to various embodiments, the atomic percentage of the rare earth element(s) in the doped piezoelectric material may be varied to affect properties of the piezoelectric layer 103. For example, assuming that the first sub-layer 103A is formed of undoped piezoelectric material and the second sub-layer 103B is formed of doped piezoelectric material, the higher the concentration of the rare earth element in the second sub-layer 103B, e.g., from about 0.5 atomic percent of the piezoelectric material up to about 40 atomic percent of the piezoelectric material, the greater the improvement in coupling coefficient $kt^2$ of the piezoelectric layer 103 over a piezoelectric layer formed entirely of undoped piezoelectric material. However, the compressive stress is higher and less evenly distributed as the atomic percentage of the rare earth element increases. Notably, when the atomic percentage of the rare earth element is relatively high in a thin second sub-layer 103B, e.g., in a range of about 30 atomic percent to about 40 atomic percent, the resulting piezoelectric layer 103 may have a desirable balance between improved coupling coefficient $kt^2$ and improved compressive stress characteristics. For example, the first sub-layer 103A may be considerably thicker than the second sub-layer 103B (e.g., 90 percent first sub-layer 103A and 10 percent second sub-layer 103B) to provide very low and evenly distributed compressive stress, while the second sub-layer 103B may have a relatively large atomic percentage of a rare earth element (e.g., about 40 atomic percent) to still provide improved coupling coefficient $kt^2$. Or, the first sub-layer 103A and the second sub-layer 103B may have about the same thickness to provide improved compressive stress characteristics, while the second sub-layer 103B may have a relatively small atomic percentage of a rare earth element (e.g., less than about 10 atomic percent) to provide improved coupling coefficient $kt^2$. Generally, the atomic percentage of the rare earth element(s) varies inversely to the thickness of the sub-layer comprising the doped piezoelectric material in order to provide the desired balance between compressive stress and coupling coefficient $kt^2$. Of course, the balance between compressive stress and coupling coefficient $kt^2$ may be varied to provide unique benefits for any particular situation or to meet application specific design requirements of various implementations, as would be apparent to one skilled in the art.

When the doped piezoelectric material in the piezoelectric layer 103 comprises doped AlN, a number of Al atoms within the AlN crystal lattice are replaced with a rare earth element at a predetermined percentage, referred to as a "doping element." In alternative configurations, a number of Al atoms within the AlN crystal lattice may be replaced with more than one type of rare earth element at predetermined percentages, respectively. Because the doping elements replace only Al atoms (e.g., of an Al target), the percentage of nitrogen atoms in the piezoelectric material remains substantially the same regardless of the amount of doping. When percentages of doping elements are discussed herein, it is in reference to the total atoms (including nitrogen) of the AlN piezoelectric material. The rare earth elements include scandium (Sc), yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu), as known by one of ordinary skill in the art. The various embodiments contemplate incorporation of any one or more rare earth elements, although specific examples are discussed herein.

According to various alternative embodiments, the undoped and doped piezoelectric material may be included in a piezoelectric layer in a number of ways. For example, the piezoelectric layer may be formed of one undoped sub-layer formed of undoped piezoelectric material and one doped sub-layer formed of doped piezoelectric material, as discussed above with reference to FIG. 3B. Alternatively, the piezoelectric layer may include multiple undoped sub-layers formed of undoped piezoelectric material and/or multiple doped sub-layers formed of doped piezoelectric material. Further, the piezoelectric layer may include no sub-layers, in which case the piezoelectric layer is a single layer of piezoelectric material having undoped and doped portions, formed by varying the amount of doping during the formation process, as discussed below.

For purposes of illustration, the undoped sub-layer (e.g., first sub-layer 103A) of the piezoelectric layer 103 may be formed of AlN, and the doped sub-layer (e.g., second sub-layer 103B) of the piezoelectric layer 103 may be formed of AlN doped with Sc. For example, for the first sub-layer 103A, Al may be sputtered onto a seed layer grown on a top surface of the first electrode 102, or sputtered directly on the top surface of the first electrode 102, in the presence of an argon (Ar)-nitrogen ($N_2$) gas atmosphere inside a reaction chamber. The top surface of the first electrode 102 may be previously cleaned using Ar and/or hydrogen ($H_2$) gas. For the second sub-layer 103B, combined aluminum and scandium may be sputtered directly on the top surface of the first sub-layer 103A, also in the presence of the Ar—$N_2$ gas atmosphere inside the reaction chamber. More particularly, in various embodiments, a composite target (or multiple targets) formed of Al and the desired proportion of Sc (thus effectively forming an Al—Sc alloy) is provided in the reaction chamber. Application of AC power creates Ar—$N_2$ plasma with which the target reacts, resulting in sputter deposition of nitrogen, aluminum and scandium atoms in proportionate amounts to the top surface of the first sub-layer 103A). Examples of general AlN sputter deposition processes are provided by U.S. Patent App. Pub. No. 2011/0180391 to Larson, III et al., published on Jul. 28, 2011, which is hereby incorporated by reference in its entirety.

In an embodiment, the target (or multiple targets) formed of Al with the desired proportion(s) of rare earth element(s) may be a previously formed alloy of Al and the rare earth element(s) mixed in the desired proportions. In an alternative embodiment, the target may be a composite target formed substantially of Al, and the rare earth element(s) are introduced by forming holes in the aluminum target and inserting "plugs" of the rare earth element(s) into the respective holes in the desired proportions. The percentage of each rare earth element corresponds to the collective volume of that element inserted into one or more respective holes, which displaces a corresponding volume of aluminum. The size and number of holes, as well as the amount of the rare earth element filling each of the holes, may be determined on a case-by-case basis, depending on the desired percentages of doping. For example, the holes may be drilled partially or entirely through the aluminum target in the desired sizes and numbers in various patterns. Similarly, in alternative embodiments, the rare earth element(s) may be added to the Al target in the desired proportion using various alternative types of insertions, without departing from the scope of the present teachings. For example, full or partial rings formed of the rare earth element(s), respectively, may be inlaid in each Al target. The number, width, depth and circumference of each ring may be adjusted to provide the desired proportion of each particular element.

In alternative embodiments, the Al and doping rare earth elements may be sputtered directly on the top surface of the first sub-layer 103A using multiple targets formed of the different elements, respectively. For example, an Al—Sc—Y alloy may be applied using an Al target, an Sc target and a Y target separately reacting to the Ar—$N_2$ plasma. The desired proportions of the elements (e.g., the Al and the rare earth element dopants) may be obtained by varying the AC power applied to each of the targets and/or the sizes of the targets in relation to one another. Of course, any other process for applying rare earth elements in desired proportions to form a doped piezoelectric layer may be used without departing from the scope of the present teachings.

Generally, the Al and N are proportioned at approximately 50 percent each (i.e., the overall atomic percentage of the Al is approximately 50). The Sc atoms and other rare earth elements, for example, replace Al atoms (in the AlN crystal lattice), while the proportionate amount of nitrogen stays substantially the same. So, for example, the Al target may contain about 5 percent Sc, in which case the Al in the doped second sub-layer 103B of the piezoelectric layer 103 has an atomic percentage of approximately 47.5, while the Sc has an atomic percentage of approximately 2.5. The atomic consistency of the second sub-layer 103B of the piezoelectric layer 103 may then be represented as $Al_{0.475}Sc_{0.025}N_{0.50}$, for example.

In various embodiments, the amount of the Sc dopant and/or the Y dopant present in the doped portion of the piezoelectric layer 103 may be less than approximately ten atomic percent each, for example. Also, in various embodiments, the amount of the Sc dopant and/or the Y dopant present in the doped portion of the piezoelectric layer 103 may be less than approximately one atomic percent each, for example.

Generally, the piezoelectric layer 103 may be doped with scandium and yttrium. The aluminum and nitrogen are proportioned at approximately 50 percent each (i.e., the overall atomic percentage of the Al is approximately 50). The scandium and yttrium replace aluminum atoms (in the AlN crystal lattice), while the proportionate amount of nitrogen stays substantially the same. So, for example, the aluminum target may contain about 5 percent scandium and 5 percent yttrium in which case the aluminum in the doped piezoelectric layer 103 has an atomic percentage of approximately 45, while the each of the scandium and the yttrium in the piezoelectric layer 103 has an atomic percentage of approximately 2.5. The atomic consistency of the piezoelectric layer 103 may then be represented as $Al_{0.45}N_{0.50}Sc_{0.025}Y_{0.025}$, for example. In various embodiments, the amount of each of the scandium and yttrium dopants present in the piezoelectric layer 103 may be less than approximately ten atomic percent, for example. Also, in various embodiments, the amount of each of the scandium and yttrium dopants present in the piezoelectric layer 103 may be less than approximately one atomic percent. Generally, the doping level of yttrium is in the range of approximately 0.5% to approximately 10.0%.

Although described with reference to AlN doped with Sc and/or Y, it is understood that the doped portion may be doped with one or more other rare earth elements in substantially the same manner, without departing from the scope of the present teachings. Also, the general concept of doping a portion of the piezoelectric layer 103 with a rare earth element may be applied to other piezoelectric materials, such as zinc oxide (ZnO) or lead zirconate titanate (PZT), without departing from the scope of the present teachings.

Table 1 shows the effectiveness of reducing overall stress and cross-wafer stress variation of an AlN thin film by including undoped and doped portions in the piezoelectric layer, as shown for example by piezoelectric layer 103. More particularly, Table 1 compares stress levels of a piezoelectric layer formed entirely of AlN material doped with Sc and a piezoelectric layer formed of a first sub-layer of undoped AlN material and a second sub-layer of the AlN material doped with Sc (at the same atomic percentage). Table 1 further compares stress levels of a piezoelectric layer formed entirely of AlN material doped with Y and a piezoelectric layer formed of a first sub-layer of undoped AlN material and a second sub-layer of the AlN material doped with Y (at the same atomic percentage).

TABLE 1

| Piezoelectric Layer Material | Average Stress (MPa) | Min Stress (MPa) | Max Stress (MPa) | Standard Deviation |
|---|---|---|---|---|
| AlScN only | 541 | 363 | 694 | 127 |
| AlN/AlScN sub-layers | 117 | −2 | 326 | 72 |
| AlYN only | −772 | −383 | −1147 | 230 |
| AlN/AlYN sub-layers | 198 | 118 | 333 | 45 |

Referring to Table 1, with regard to Sc doping in the entire AlN thin film (AlScN only), average stress is 541 MPa and standard deviation across the wafer is 127 MPa, both of which are relatively large values. Utilizing "six sigma" principles for the standard deviation, the overall stress range across the wafer is about +/−390 MPa. As discussed above, the coupling coefficient $kt^2$ of the doped AlN film increases linearly by about 0.1 percent for every 100 MPa increase in stress. Accordingly, the AlN thin film would exhibit an approximately 0.8 percent variation of the coupling coefficient $kt^2$ across the wafer. In comparison, the multiple sub-layer AlN thin film (AlN/AlScN), where one of the sub-layers is formed of undoped AlN material, has an average stress of 117 MPa and a standard deviation across the wafer of 72 MPa. The overall stress range across the wafer is therefore about +/−225 MPa, which equates to only an approximately 0.4 percent variation of the coupling coefficient $kt^2$ across the wafer. A lower variation in the coupling coefficient $kt^2$ across the wafer means more of the wafer will meet the electrical specifications of the product, resulting in higher manufacturing yield, for example.

Similarly, with regard to Y doping of the entire AlN thin film (AlYN only), average stress is −772 MPa and standard deviation across the wafer is 230 MPa, both of which are relatively large values. The overall stress range across the wafer is therefore about +/−690 MPa. Accordingly, the AlN thin film would exhibit an approximately 1.4 percent variation of the coupling coefficient $kt^2$ across the wafer. In comparison, the multiple sub-layer AlN thin film (AlN/AlYN) has an average stress of 198 MPa and a standard deviation across the wafer of 45 MPa. The overall stress range across the wafer is therefore about +/−135 MPa, which equates to only an approximately 0.3 percent variation of the coupling coefficient $kt^2$ across the wafer. The advantage of using the multiple sub-layer AlN thin film is therefore even more pronounced when using Y as the dopant.

In accordance with other representative embodiments, the piezoelectric layer 103 may be doped with scandium and erbium. The aluminum and nitrogen are proportioned at approximately 50 percent each (i.e., the overall atomic percentage of the Al is approximately 50). The scandium and erbium replace aluminum atoms (in the AlN crystal lattice), while the proportionate amount of nitrogen stays substantially the same. So, for example, the aluminum target may contain about 5 percent scandium and 5 percent erbium in which case the aluminum in the doped piezoelectric layer 103 has an atomic percentage of approximately 45, while the each of the scandium and the erbium in the piezoelectric layer 103 has an atomic percentage of approximately 2.5. The atomic consistency of the piezoelectric layer 103 may then be represented as $Al_{0.45}N_{0.50}Sc_{0.025}Er_{0.025}$, for example. In various embodiments, the amount of each of the scandium and erbium dopants present in the piezoelectric layer 103 may be less than approximately ten atomic percent, for example. Also, in various embodiments, the amount of each of the scandium and erbium dopants present in the piezoelectric layer 103 may be less than approximately one atomic percent. Generally, the doping level of erbium is in the range of approximately 0.5% to approximately 20.0%.

An optional passivation layer 105 is provided over the second electrode 104. A cantilevered portion 106 of the second electrode 104 is provided on at least one side of the second electrode 104. The cantilevered portion 106 may also be referred to as a 'wing.'

The bulk acoustic wave (BAW) resonator 100 may be fabricated according to known semiconductor processing methods and using known materials. Illustratively, the bulk acoustic wave (BAW) resonator 100 may be fabricated according to the teachings of commonly owned U.S. Pat. Nos. 5,587,620; 5,873,153; 6,384,697; 6,507,983; and 7,275,292 to Ruby, et al.; and U.S. Pat. No. 6,828,713 to Bradley, et al. The disclosures of these patents are specifically incorporated herein by reference. It is emphasized that the methods and materials described in these patents are representative and other methods of fabrication and materials within the purview of one of ordinary skill in the art are contemplated.

When connected in a selected topology, a plurality of bulk acoustic wave (BAW) resonators 100 can act as an electrical filter. For example, the bulk acoustic wave (BAW) resonators 100 may be arranged in a ladder-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers.

The first and second electrodes 102, 104 each comprise an electrically conductive material (e.g., molybdenum (Mo)) and provide an oscillating electric field in the y-direction of the coordinate system shown (i.e., the direction of the thickness of the substrate 101). In the illustrative embodiment described presently, the y-axis is the axis for the TE (longitudinal) mode(s) for the resonator. In a representative embodiment, the piezoelectric layer 103 and first and second electrodes 102,104 are suspended over a cavity 107, which functions as a reflective element. The cavity 107 is formed by selective etching of the substrate 101. The cavity 107 may be formed by a number of known methods, for example as described in referenced commonly owned U.S. Pat. No. 6,384,697 to Ruby, et al. Accordingly, the bulk acoustic wave (BAW) resonator 100 is a mechanical resonator, which can be electrically coupled via the piezoelectric layer 103. Other configurations that foster mechanical resonance by BAW resonators are contemplated. For example, the bulk acoustic wave (BAW) resonator 100 can be located over another type of reflective element, such as a mismatched acoustic Bragg reflector (not shown in FIG. 1A) formed in or on the substrate 101. BAW resonators provided over an acoustic mirror are sometimes referred to as solidly mounted resonators (SMRs) and, for example, may be as described in U.S. Pat. No. 6,107,721 to Lakin, the disclosure of which is specifically incorporated into this disclosure by reference in its entirety.

The cantilevered portion 106 of the second electrode 104 extends over a gap 108, which illustratively comprises air. In a representative embodiment, a sacrificial layer (not shown) is deposited by known technique over the first electrode 102 and a portion of the piezoelectric layer 103. The second electrode 104 and passivation layer 105 are provided over the sacrificial layer. Illustratively, the sacrificial material comprises phosphosilicate glass (PSG), which illustratively comprises 8% phosphorous and 92% silicon dioxide. After the formation of the second electrode 104 and passivation layer 105, the sacrificial layer is etched away illustratively with hydrofluoric acid leaving the cantilevered portion 106. In a representative embodiment, the sacrificial layer provided to form the cantilevered portion 106 and the sacrificial layer provided to form the cavity 107 are removed in the same process step.

Notably, rather than air, the gap 108 may comprise other materials including low acoustic impedance materials, such as carbon (C) doped $SiO_2$, which is also referred as Blackdiamond; or dielectric resin commercially known as SiLK™; or benzocyclobutene (BCB). Such low acoustic impedance materials may be provided in the gap 108 by known methods. The low acoustic impedance material may be provided after removal of sacrificial material used to form the gap 108, or may be used instead of the sacrificial material in the gap 108, and not removed.

The region of contacting overlap of the first and second electrodes 102, 104, the piezoelectric layer 103 and the cavity 107, or other reflective element (e.g., Bragg reflector (not shown)) is referred to as an active area 110 of the bulk acoustic wave (BAW) resonator 100. By contrast, an inactive area of the bulk acoustic wave (BAW) resonator comprises a region of overlap between first electrode 102 or second electrode 104, or both, and the piezoelectric layer 103 is not disposed over the cavity 107, or other suspension structure, or acoustic mirror. As described more fully in the parent application, it is beneficial to the performance of the bulk acoustic wave (BAW) resonator 100 to reduce the area of the inactive region of the bulk acoustic wave (BAW) resonator 100 to the extent practical.

The cantilevered portion 106 extends beyond an edge of the active area 110 by a width 109 as shown. An electrical contact 111 is connected to a signal line (not shown) and electronic components (not shown) selected for the particular application of the bulk acoustic wave (BAW) resonator 100. This portion of the bulk acoustic wave (BAW) resonator 100 comprises an interconnection side 112 of the bulk acoustic wave (BAW) resonator 100. As will become clearer as the present description continues, the interconnection side 112 of the second electrode 104 to which the electrical contact 111 is made does not comprise a cantilevered portion. By contrast, one or more non-connecting sides of the bulk acoustic wave (BAW) resonator 100 may comprise cantilevered portions 106 that extend beyond the edge of the active area 110.

FIG. 1B shows a top view of the bulk acoustic wave (BAW) resonator 100 shown in cross-sectional view in FIG. 1A and in accordance with a representative embodiment. The bulk acoustic wave (BAW) resonator 100 also comprises the second electrode 104 with the optional passivation layer 105 disposed thereover. The second electrode 104 of the present embodiment is illustratively apodized to reduce acoustic losses. Further details of the use of apodization in bulk acoustic wave (BAW) resonators may be found in commonly owned U.S. Pat. No. 6,215,375 to Larson III, et al; or in commonly owned U.S. Pat. No. 7,629,865 entitled "Piezoelectric Resonator Structures and Electrical Filters," to Richard C. Ruby. The disclosures of these patents are specifically incorporated herein by reference in their entirety.

The second electrode 104 comprises non-connecting sides 113 and interconnection side 112. In a representative embodiment, cantilevered portions 106 are provided along each non-contacting side 113 and have the same width. This is merely illustrative, and it is contemplated that at least one side 113, but not all comprise a cantilevered portion 106. Furthermore, it is contemplated that the second electrode 104 comprises more or fewer than four sides as shown. For example, a pentagonal-shaped second electrode is contemplated comprising four sides with cantilevered portions on one or more of the sides, and the fifth side providing the interconnection side. In a representative embodiment, the shape of the first electrode 102 is substantially identical to the shape of the second electrode 104. Notably, the first electrode 102 may comprise a larger area than the second electrode 104, and the shape of the first electrode 102 may be different than the shape of the second electrode 104.

The fundamental mode of the bulk acoustic wave (BAW) resonator 100 is the longitudinal extension mode or "piston" mode. This mode is excited by the application of a time-varying voltage to the two electrodes at the resonant frequency of the bulk acoustic wave (BAW) resonator 100. The piezoelectric material converts energy in the form of electrical energy into mechanical energy. In an ideal FBAR having infinitesimally thin electrodes, resonance occurs when the applied frequency is equal to the velocity of sound of the piezoelectric medium divided by twice the thickness of the piezoelectric medium: $f=v_{ac}/(2*T)$, where T is the thickness of the piezoelectric medium and $v_{ac}$ is the acoustic phase velocity. For resonators with finite thickness electrodes, this equation is modified by the weighted acoustic velocities and thicknesses of the electrodes.

A quantitative and qualitative understanding of the Q of a resonator may be obtained by plotting on a Smith Chart the ratio of the reflected energy to applied energy as the frequency is varied for the case in which one electrode is connected to ground and another to signal, for an FBAR resonator with an impedance equal to the system impedance at the resonant frequency. As the frequency of the applied energy is increased, the magnitude/phase of the FBAR resonator sweeps out a circle on the Smith Chart. This is referred to as the Q-circle. Where the Q-circle first crosses the real axes (horizontal axes), this corresponds to the series resonance frequency $f_s$. The real impedance (as measured in Ohms) is $R_s$. As the Q-circle continues around the perimeter of the Smith chart, it again crosses the real axes. The second point at which the Q circle crosses the real axis is labeled $f_p$, the parallel or anti-resonant frequency of the FBAR. The real impedance at $f_p$ is $R_p$.

Often it is desirable to minimize $R_s$ while maximizing $R_p$. Qualitatively, the closer the Q-circle "hugs" the outer rim of the Smith chart, the higher the Q-factor of the device. The Q-circle of an ideal lossless resonator would have a radius of one and would be at the edge of the Smith chart. However, as noted above, there are energy losses that impact the Q-factor of the device. For instance, and in addition to the sources of acoustic losses mentioned above, Rayleigh-Lamb (lateral or spurious) modes are in the x,y dimensions of the piezoelectric layer 103. These lateral modes are due to interfacial mode conversion of the longitudinal mode traveling in the z-direction; and due to the creation of non-zero propagation vectors, $k_x$ and $k_y$, for both the TE mode and the various lateral modes (e.g., the S0 (symmetric) mode and the zeroth and (asymmetric) modes, A0 and A1), which are due to the difference in effective velocities between the regions where electrodes are disposed and the surrounding regions of the resonator where there are no electrodes. At a specific frequency, the acoustic wave length of a bulk acoustic wave (BAW) resonator is determined by v/f, where v is acoustic velocity and f is frequency. It is believed that periodicity of Qp (i.e., the position of maxima and minima as a function of the width of the cantilevered portion 106) is related to the acoustic wave length. At a maxima of Qp, the vibration of the cantilevered portion 106 is comparatively far from its mechanical resonance; while at a minima mechanical resonance of the cantilevered portion 106 occurs. This phenomenon can be appreciated from a review of FIG. 2A below, for example: as frequency decreases, acoustic wave length increases, and the width of the cantilevered portion 106 at a maxima increases accordingly.

Regardless of their source, the lateral modes are parasitic in many resonator applications. For example, the parasitic lateral modes couple at the perimeter of the resonator and remove energy available for the longitudinal modes and thereby reduce the Q-factor of the resonator device. Notably, as a result of parasitic lateral modes and other acoustic losses sharp reductions in Q can be observed on a Q-circle of the Smith Chart of the $S_{11}$ parameter. These sharp reductions in Q-factor are known as "rattles" or "loop-de-loops," which are shown and described below.

The cantilevered portion(s) 106 of the representative embodiments provide a change in the acoustic impedance at the boundary of the active area 110 of the bulk acoustic wave (BAW) resonator 100. As a result, reflections of lateral modes at the boundary are promoted. In a representative embodiment, the boundary of the active area 110 of the bulk acoustic wave (BAW) resonator and the cantilevered portion 106 is solid (electrodes and piezoelectric layer) and air, which presents a comparatively large impedance mismatch and a comparatively high reflection coefficient. As a result, lateral modes are comparatively highly reflected, which improves the Q-factor by two mechanisms. First, because the reflected lateral modes are not transmitted, their energy is not lost. Improving the losses by reducing transmission of lateral modes outside the active area 110 of the bulk acoustic wave (BAW) resonator 100 can increase the Q-factor of the bulk acoustic wave (BAW) resonator 100. Second, a portion of the reflected lateral modes is converted into desired longitudinal modes. The greater the wave energy is in longitudinal modes, the higher the Q-factor. As a result, the cantilevered portion(s) 106 of the bulk acoustic wave (BAW) resonator 100 enhances the Q-factor of both the parallel and the series resonance (i.e., $Q_p$ and $Q_s$).

Figure 2A:
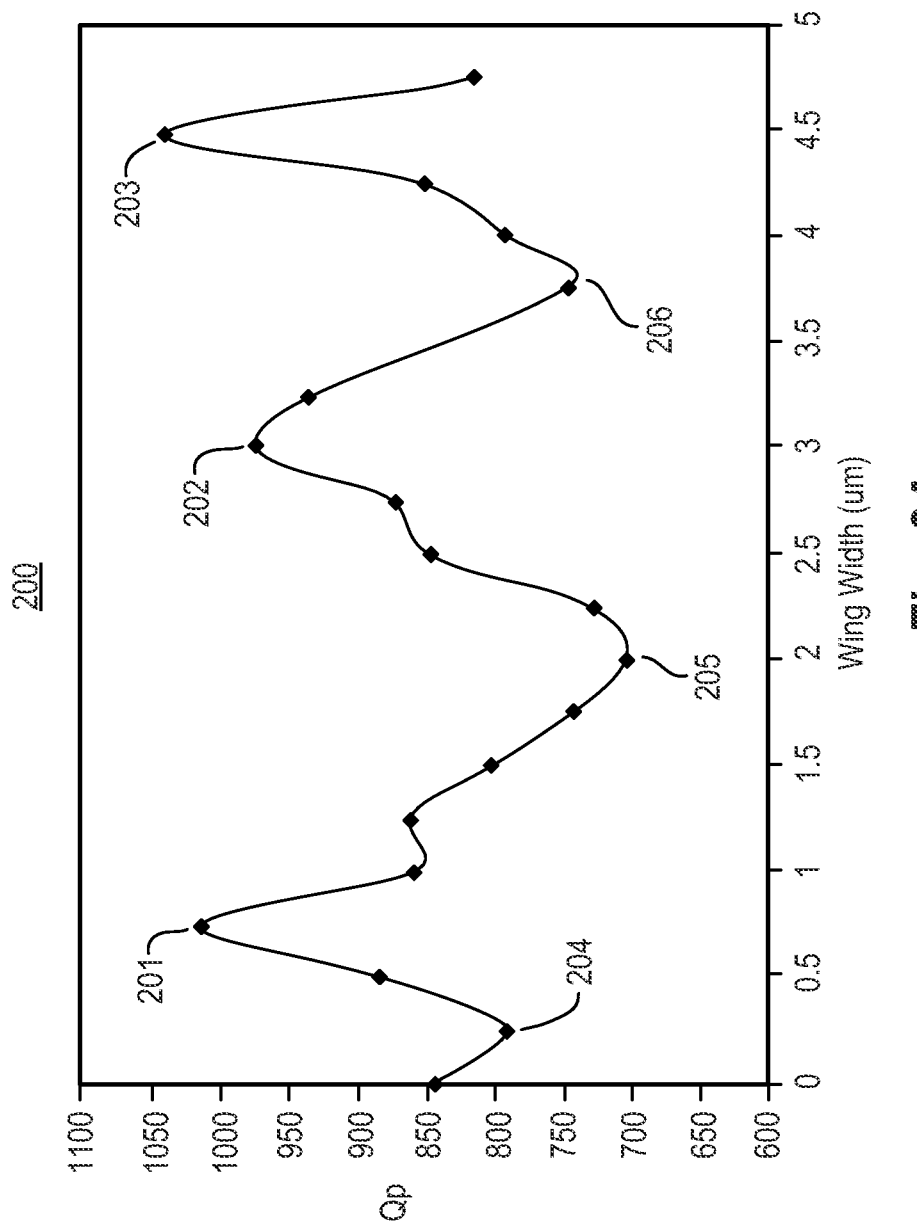
FIG. 2A shows a graph of the Q-factor at parallel resonance ($Q_p$) versus width of the cantilevered portion(s) of a bulk acoustic wave (BAW) resonator in accordance with a representative embodiment.

FIG. 2A shows a graph 200 of the Q-factor at parallel resonance ($Q_p$) versus width (e.g., width 109, also referred to as "wing width") of the cantilevered portion(s) 106 ("wings") of a bulk acoustic wave (BAW) resonator in accordance with a representative embodiment. The graph 200 provides data of a bulk acoustic wave (BAW) resonator comprising three cantilevered portions 106, such as illustratively shown in FIGS. 1A and 1B. The Q-factor is dependent on the width of the cantilevered portion 106 for a given parallel resonance frequency. As shown, there are relative maxima in $Q_p$ at points 201, 202 and 203; and local minima at points 204, 205 and 206 as the width 109 increases. Notably, $Q_p$ improves significantly at a certain width 109, compared with width 109 of the cantilevered portion 106 being zero, which is equivalent to a bulk acoustic wave (BAW) resonator having substantially the same structure as bulk acoustic wave (BAW) resonator 100 but not comprising the cantilevered portion 106.

Improvements in $Q_p$ due to the inclusion of the cantilevered portion 106 results from different boundary conditions at the edge of the active area 110 of the bulk acoustic wave (BAW) resonator 100 compared to a bulk acoustic wave (BAW) resonator not comprising a cantilevered portion(s). As described above, the cantilevered portion 106 at the edge of active area 110 of the bulk acoustic wave (BAW) resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 204, 205, 206, result in energy not reflected back into the active area 110 of the bulk acoustic wave (BAW) resonator 100, losses and reduced Q. Accordingly, when designing bulk acoustic wave (BAW) resonator 100, the width 109 of the cantilevered portion 106 is beneficially selected at a relative maximum 201, 202, 203, and not at a relative minimum 204, 205, 206.

Figure 2B:
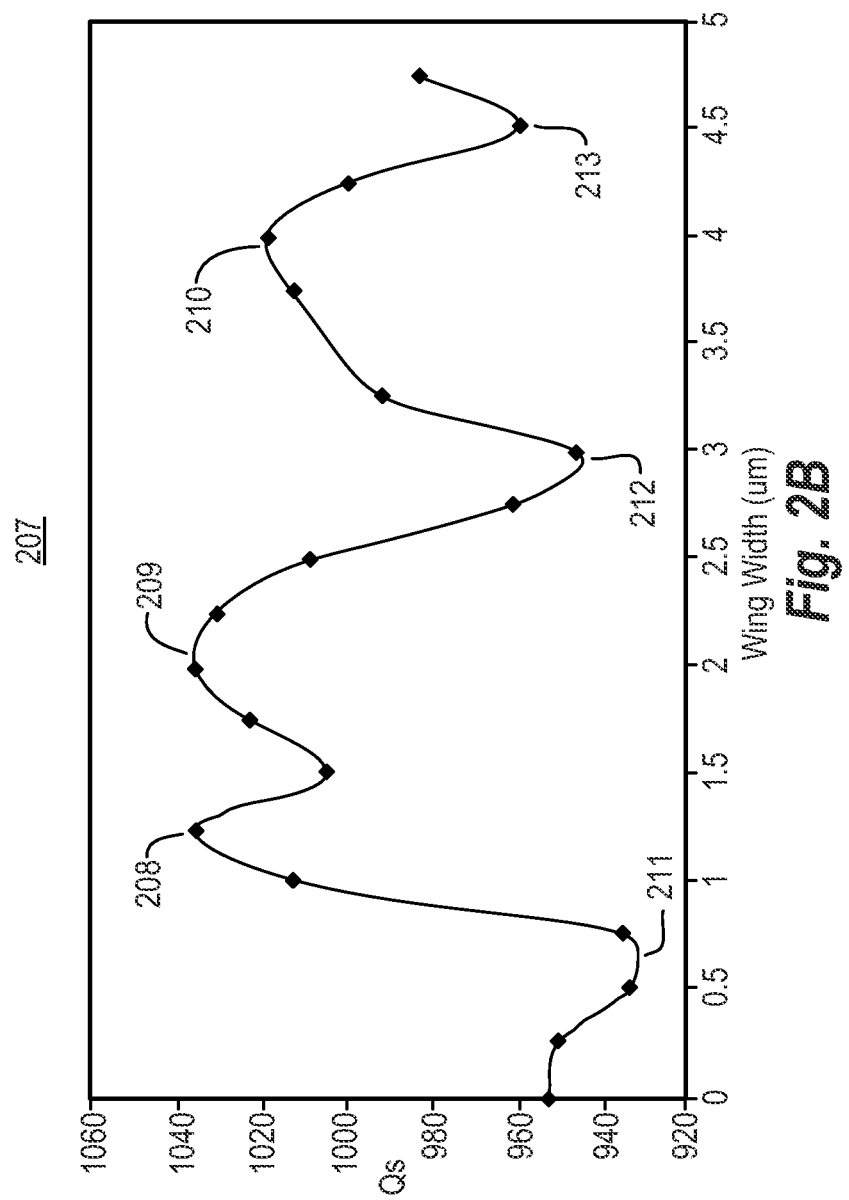
FIG. 2B shows a graph of the Q-factor at series resonance ($Q_s$) versus width of the cantilevered portion(s) of a bulk acoustic wave (BAW) resonator in accordance with a representative embodiment.

FIG. 2B shows a graph 207 of the Q-factor at series resonance ($Q_s$) versus width (e.g., width 109 ('wing width')) of the cantilevered portion 106 ('wing') of a bulk acoustic wave (BAW) resonator in accordance with a representative embodiment. The graph 207 provides data of a bulk acoustic wave (BAW) resonator comprising three cantilevered portions 106, such as illustratively shown in FIGS. 1A and 1B. The Q-factor is dependent on the width of the cantilevered portion 106 for a given series resonance frequency. As shown, there are relative maxima in $Q_s$ at points 208, 209 and 210; and local minima at points 211, 212 and 213 as the width 109 increases. Notably, $Q_s$ improves significantly at a certain width 109, compared with width=0 of the cantilevered portion 106, which is equivalent to a bulk acoustic wave (BAW) resonator having substantially the same configuration as bulk acoustic wave (BAW) resonator 100 but without cantilevered portions 106.

As described above, the cantilevered portion 106 at the edge of active area 110 of the bulk acoustic wave (BAW) resonator will reflect certain acoustic modes due to the impedance mismatch at the boundary of the cantilevered portion 106 and the active area 110, resulting in improved Q. It is believed that the local minima may result from the excitation of a mechanical resonance of the cantilevered portion 106, which results in losses. The excited resonance conditions at relative minima 211, 212 and 213 result in energy not reflected back into the active area 110 of the bulk acoustic wave (BAW) resonator 100, losses and, therefore, reduced Q. Accordingly, when designing bulk acoustic wave (BAW) resonator 100, the width 109 of the cantilevered portion 106 is beneficially selected at a relative maximum 208, 209 or 210, and not at a relative minimum 211, 212 or 213.

Moreover, because the cantilevered portion 106 does not generate spurious lateral modes, there is no attendant degradation in Q near the series resonance frequency as can occur with the inclusion of known raised frame elements (sometimes referred to as 'outies') and known recessed frame elements (sometimes referred to as 'innies'.) Notably, both raised frame elements and recessed frame elements may be disposed annularly about the bulk acoustic wave (BAW) resonator and are sometimes referred to as annular recesses and annular frames. The raised frame elements and recessed frame elements may generate spurious modes, but recessed frame elements improve the coupling coefficient ($k_t^2$), and raised frame elements may slightly decrease $k_t^2$. Furthermore the cantilevered portion 106 does not generate spurious modes because its location is not within the active area 110. The cantilevered portion 106 also does not degrade $k_t^2$ as significantly as the raised and recessed frame elements. As can be appreciated from a review of FIG. 2A, $k_t^2$ at peak Q corresponds to a width of the cantilevered portion 106 of approximately 4.75 μm and is approximately 5.2. This represents an increase in $k_t^2$ of approximately 10% greater than that of a known bulk acoustic wave (BAW) resonator with a raised frame element.

Figure 3A:
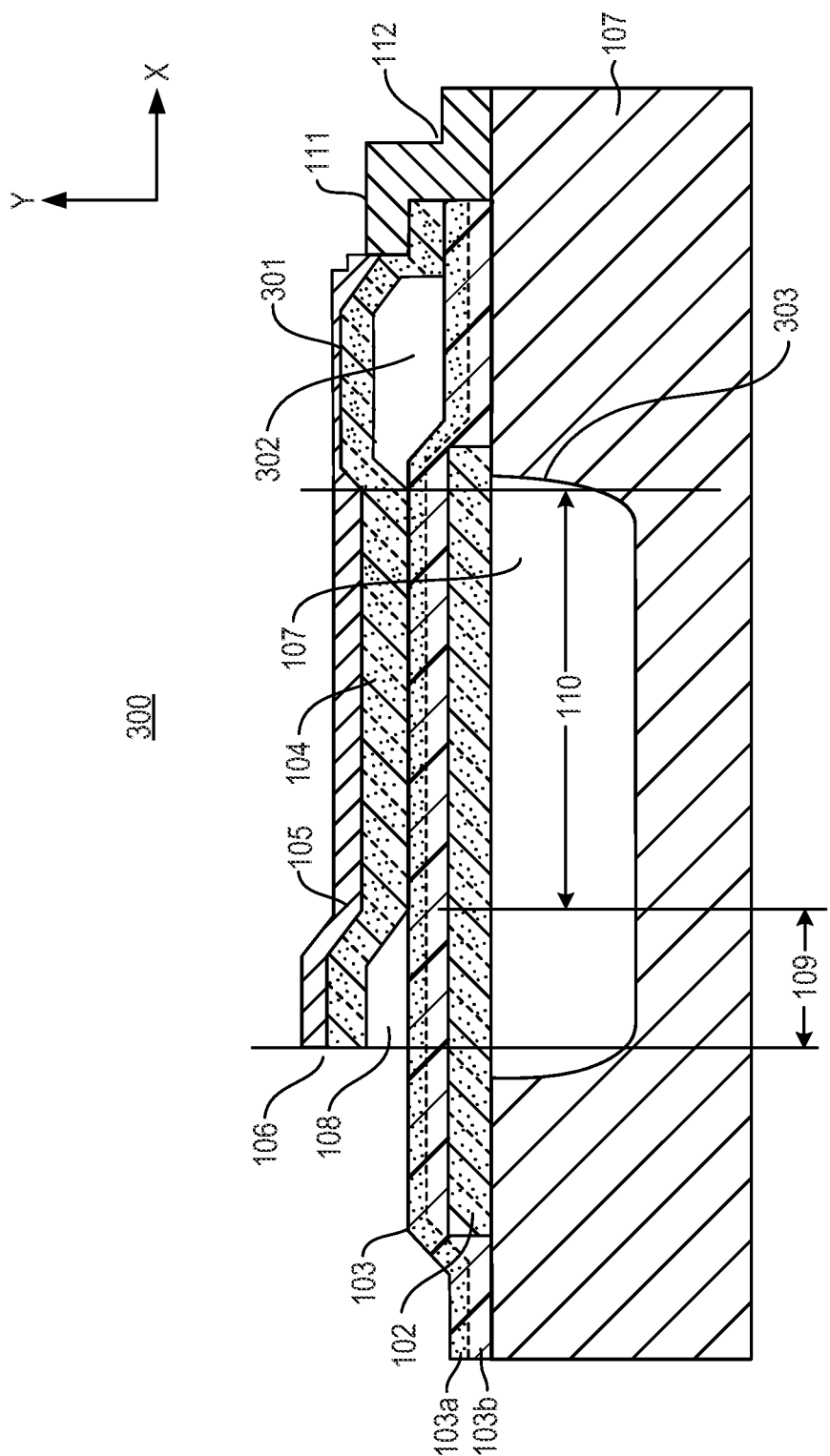
FIG. 3A shows a cross-sectional view of a bulk acoustic wave (BAW) resonator in accordance with a representative embodiment.

FIG. 3A shows a cross-sectional view of a bulk acoustic wave (BAW) resonator 300 in accordance with a representative embodiment. Many of the features of the bulk acoustic wave (BAW) resonator 300 are common to those of bulk acoustic wave (BAW) resonator 100 described in connection with representative embodiments in FIGS. 1A-1B. The details of common features, characteristics and benefits thereof are not repeated in order to avoid obscuring the presently described embodiments.

As described above, the piezoelectric layer 103 of the bulk acoustic wave (BAW) resonator 300 comprises two or more sub-layers (e.g., first and second sub-layers 103A, 103B described above) of undoped and/or doped piezoelectric materials, in accordance with a representative embodiment. In other representative embodiments described below, the piezoelectric layer 103 of the bulk acoustic wave (BAW) resonator 300 comprises a single layer having varying amounts of dopants within the piezoelectric material, in accordance with another representative embodiment.

The bulk acoustic wave (BAW) resonator 300 comprises a bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the bulk acoustic wave (BAW) resonator 300. As depicted in FIG. 3A, the cavity 107 has an edge 303, and the bridge 301 extends past the edge 303 of the cavity 107 (or similar reflective element, such as a mismatched Bragg reflector) and over the substrate 101. As such, in a representative embodiment, the bridge 301 is disposed partially over the cavity 107, extends over the edge 303 of the cavity 107, and is disposed partially over the substrate 101.

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the bulk acoustic wave (BAW) resonator 300. To this end, inclusion of the bridge 301 with the cantilevered portion 106 in the bulk acoustic wave (BAW) resonator 300 results in an improvement in the Q-factor at parallel resonance (Qp) and some impact on the Q-factor at series resonance (Qs). This is somewhat expected since the bridge 301 predominantly impacts Qp, as described in the parent application.

Figure 3B:
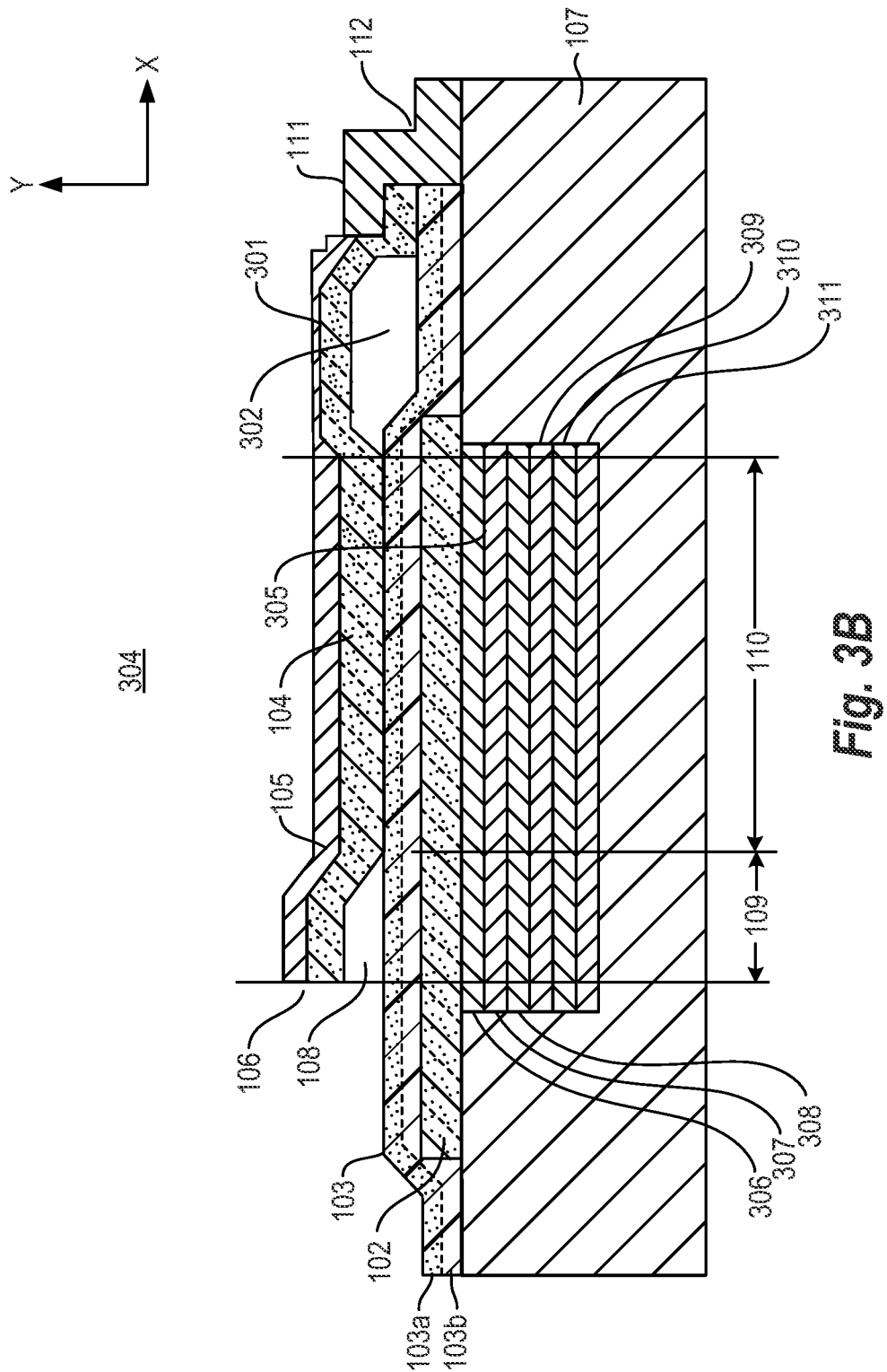
FIG. 3B shows a cross-sectional view of a bulk acoustic wave (BAW) resonator in accordance with a representative embodiment.

FIG. 3B shows a cross-sectional view of a bulk acoustic wave (BAW) resonator 304 in accordance with a representative embodiment. Many of the features of the bulk acoustic wave (BAW) resonator 304 are common to those of bulk acoustic wave (BAW) resonator 100, 300 described in connection with representative embodiments in FIGS. 1A-1B and 3A. The details of common features, characteristics and benefits thereof are not repeated in order to avoid obscuring the presently described embodiments.

Notably, in accordance with a representative embodiment, the piezoelectric layer 103 of the BAW resonator 304 comprises two or more sub-layers (e.g., first and second sub-layers 103A, 103B described above) of undoped and/or doped piezoelectric materials. In other representative embodiments described below, the piezoelectric layer 103 of the BAW resonator 304 comprises a single layer having varying amounts of dopants within the piezoelectric material, in accordance with another representative embodiment.

The bulk acoustic wave (BAW) resonator 304 comprises a bridge 301 along the interconnection side 112. The bridge 301 provides a gap 302, which may be a void (e.g., air) or may be filled with a low acoustic impedance material. The bridge 301 is described in the parent application (now U.S. Pat. No. 8,248,185), and as such many of the details of the bridge 301 are not repeated in the present application to avoid obscuring the description of the representative embodiments of the bulk acoustic wave (BAW) resonator 304. As depicted in FIG. 3A, the bulk acoustic wave (BAW) resonator 304 comprises an acoustic reflector 305. The acoustic reflector 305 has an edge 303, and the bridge 301 extends past the edge 303 of the acoustic reflector 305 and over the substrate 101. As such, in a representative embodiment, the bridge 301 is disposed partially over the acoustic reflector 305, extends over the edge 303 of the cavity 107, and is disposed partially over the substrate 101.

The acoustic reflector 305 may be a distributed Bragg reflector (DBR) or other acoustic mirror, for example, formed of multiple acoustic impedance layers, indicated by representative first through sixth acoustic impedance layers 306 to 311. The first electrode 102 is disposed over the acoustic reflector 305, the piezoelectric layer 103 is disposed over the first electrode 102, and the second electrode 104 is disposed over the piezoelectric layer 103. As should be appreciated by one of ordinary skill in the art, the structure provided by the first electrode 102, the piezoelectric layer 103 and the second electrode 104 forms the acoustic stack of the BAW resonator 304.

More particularly, the acoustic reflector 305 is formed in or on the top of the substrate 101 and provides acoustic isolation between the substrate 101 and the acoustic stack. The acoustic impedance layers 306~311 of the acoustic reflector 305 are formed of materials having different acoustic impedances. For example, the acoustic impedance layers 306~311 may have alternating low and high acoustic impedances, such that acoustic impedance layer 306 has relatively low acoustic impedance, acoustic impedance layer 307 has relatively high acoustic impedance, acoustic impedance layer 308 has relatively low acoustic impedance, acoustic impedance layer 309 has relatively high acoustic impedance, acoustic impedance layer 310 has relatively low acoustic impedance, and acoustic impedance layer 311 has relatively high acoustic impedance. These differing acoustic impedances can be obtained, for instance, by forming the odd numbered acoustic impedance layers 307, 309 and 311 of a relatively soft material, and forming the even numbered acoustic impedance layers 306, 308 and 310 of a relatively hard material. Notably, the number of acoustic impedance layers may differ from six, without departing from the scope of the present teachings. Generally, the number of acoustic impedance layers may be determined by a tradeoff between desired mirror performance (e.g., the more layers the better) and cost and processing issues (e.g., the fewer layers the cheaper and more straightforward mirror growth and post-processing).

The amount of acoustic isolation provided by acoustic reflector 305 generally depends on the contrast between the acoustic impedances of adjacent acoustic impedance layers 306~311, with a greater amount of contrast creating better acoustic isolation. In some embodiments, the acoustic reflector 305 is formed in pairs of dielectric materials having contrasting acoustic impedances. For example, the odd acoustic reflector layers 307, 309 and 311 may be formed of a material having low acoustic impedance, such as silicon oxide ($SiO_x$), where x is an integer, while the even acoustic impedance layers 306, 308 and 310, paired with corresponding odd acoustic impedance layers 307, 309, 311 may be formed of a material having high acoustic impedance, such as tungsten (W) or molybdenum (Mo). In another example, the odd acoustic reflector layers 307, 309 and 311 may be formed of carbon-doped silicon oxide (CDO), while the even acoustic impedance layers 306, 308 and 310 paired with corresponding odd acoustic reflector layers 307, 309 and 311, may be formed of silicon nitride ($SiN_x$), where x is an integer. A benefit of this pair is that the layer may be grown in a single machine by depositing CDO onto a silicon wafer, for example, within a first chamber, moving the wafer to a second chamber, depositing silicon nitride on the wafer in the second chamber, moving the wafer back into the first chamber, and so on. This process may be less expensive (e.g., by about 10 percent) than producing an etched air cavity, for example, thus providing a cost effective substitute for an air cavity.

The acoustic reflector 305 and bulk acoustic wave (BAW) resonator may be fabricated using various alternative techniques, an example of which is described in U.S. Pat. No. 7,358,831 to Larson, III et al., which is hereby incorporated by reference in its entirety. Of course, the low and high acoustic impedance materials forming the stacked layers of the acoustic reflector 305 may vary without departing from the scope of the present teachings. The present teachings contemplate the use of FBARs (e.g., bulk acoustic wave (BAW) resonator 300) or SMRs (e.g., bulk acoustic wave (BAW) resonator 304) in a variety of applications, including filters (e.g., ladder filters comprising a plurality of BAW resonators).

As described above, the cantilevered portion 106 provides an improvement in the Q-factor. Similarly, the bridge 301 also provides an improvement in the Q-factor. Beneficially, the combination of the cantilevered portion 106 and the bridge 301 provides a further improvement in the Q-factor of the bulk acoustic wave (BAW) resonator 300. To this end, inclusion of the bridge 301 with the cantilevered portion 106 in the bulk acoustic wave (BAW) resonator 300 results in an improvement in the Q-factor at parallel resonance (Qp) and some impact on the Q-factor at series resonance (Qs). This is somewhat expected since the bridge 301 predominantly impacts Qp, as described in the parent application.

Figure 4A:
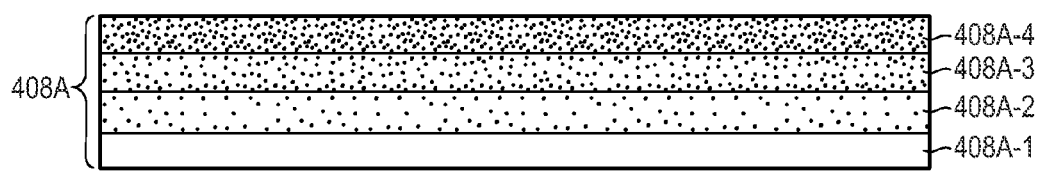
FIGS. 4A and 4B show cross-sectional views of piezoelectric layers formed of undoped and doped portions, in accordance with representative embodiments.
Figure 4B:
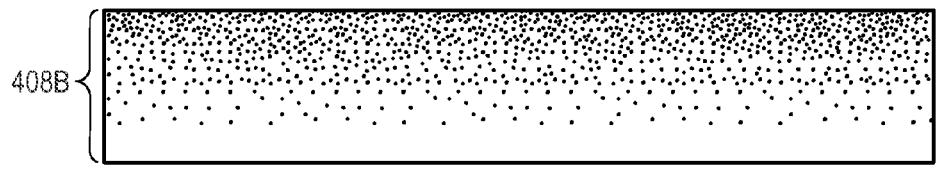

FIG. 4A shows a cross-sectional view of piezoelectric layer 408A, formed of more than two sub-layers of undoped and/or doped piezoelectric materials, in accordance with a representative embodiment. FIG. 4B shows a cross-sectional view of piezoelectric layer 408B, formed of a single layer having varying amounts of dopants within the piezoelectric material, in accordance with another representative embodiment. As noted above, the piezoelectric layer 130 described in connection with bulk acoustic wave (BAW) resonators 100, 300 and 304 above, comprises piezoelectric layer 408A or piezoelectric layer 408B Referring to FIG. 4A, the piezoelectric layer 408A includes representative first sub-layer 408A-1, second sub-layer 408A-2, third sub-layer 408A-3, and fourth sub-layer 408A-4, stacked in this order on a bottom electrode, such as the first electrode 102. The first through fourth sub-layers 408-1 to 408-4 are formed in separate processing steps to provide collectively the piezoelectric layer 408A. At least one of the first through fourth sub-layers 408-1 to 408-4 is formed of undoped piezoelectric material, such as AlN, and at least another one of the first through fourth sub-layers 408-1 to 408-4 is formed of doped piezoelectric material, such as AlScN. As an example, the first sub-layer 408-1 may be formed of undoped AlN material, while the second through fourth sub-layers 408-2 to 408-4 may be formed of AlN material doped with varying atomic percentages of Sc. For example, the second through fourth sub-layers 408-2 to 408-4 may be formed of doped AlN material having incrementally increasing atomic percentages of the Sc, where the second sub-layer 408-2 has the lowest atomic percentage of Sc and the fourth sub-layer 408-4 has the highest atomic percentage of Sc. This is indicated schematically by the increasing density of dots in the second through fourth sub-layers 408-2 to 408-4 of the piezoelectric layer 408A, respectively.

Of course, in alternative configurations, the second through fourth sub-layers 408-2 to 408-4 may be formed of doped AlN material having incrementally decreasing atomic percentages of Sc, or atomic percentages of Sc that are simply different from one another without necessarily increasing or decreasing. As another example, the first through fourth sub-layers 408-1 to 408-4 may alternate between undoped AlN material and doped AlN material, such as AlScN, where the doped AlN material (e.g., in second and fourth sub-layers 408-2 and 408-4) may have the same or different atomic percentages of Sc. The numbers of sub-layers, as well as the number and types of dopants, may vary without departing from the scope of the present teachings. For example, multiple doped sub-layers may include piezoelectric material doped with different rare earth elements from one another, piezoelectric material doped with different atomic percentages of the same or different rare earth elements, or doped and/or undoped sub-layers may include different piezoelectric materials.

Referring to FIG. 4B, the piezoelectric layer 408B includes a single layer having representative undoped and doped portions, formed on a bottom electrode, such as the first electrode 102. The piezoelectric layer 408B is formed in a single processing step, in which the amount of doping is adjusted in the course of the processing step. That is, the piezoelectric layer 408B includes a single layer of variously doped piezoelectric material, such as AlN, having varying atomic percentages of at least one rare earth element, such as Sc and/or Y, over a thickness of the piezoelectric layer 408B. A portion of the piezoelectric material in the piezoelectric layer 408B is undoped. For example, as indicated in FIG. 4B, the piezoelectric layer 408B may be formed of undoped AlN material at the bottom of the piezoelectric layer 408B and doped AlN material having incrementally increasing atomic percentages of the Sc provided throughout the formation process, resulting in a relatively small atomic percentage of Sc near the bottom of the piezoelectric layer 408B (immediately above the undoped AlN material portion) and a relatively large atomic percentage of Sc at the top of the piezoelectric layer 408B. The piezoelectric material thus includes incrementally increasing atomic percentages of the Sc over the thickness of the piezoelectric layer 408B. This is indicated schematically by the increasing density of dots toward the top of the piezoelectric layer 408B.

Of course, in alternative configurations, the piezoelectric layer 408B may be formed of doped AlN material having incrementally decreasing atomic percentages of the Sc throughout the formation process, resulting in a relatively large atomic percentage of Sc near the bottom of the piezoelectric layer 408B and a relatively large atomic percentage of Sc at the top of the piezoelectric layer 408B. The piezoelectric material thus includes incrementally decreasing atomic percentages of Sc over the thickness of the piezoelectric layer 408B. Also, in a configuration having an incrementally decreasing atomic percentage of Sc, the undoped AlN material portion of the piezoelectric layer 408B may be located at the top of the piezoelectric layer 408B. As another example, the atomic percentages of Sc may vary throughout the piezoelectric layer 408B, i.e., without necessarily increasing or decreasing in relation to the thickness of the piezoelectric layer 408B. The degrees of doping, as well as the number and types of dopants, may vary without departing from the scope of the present teachings.

Figure 5A:
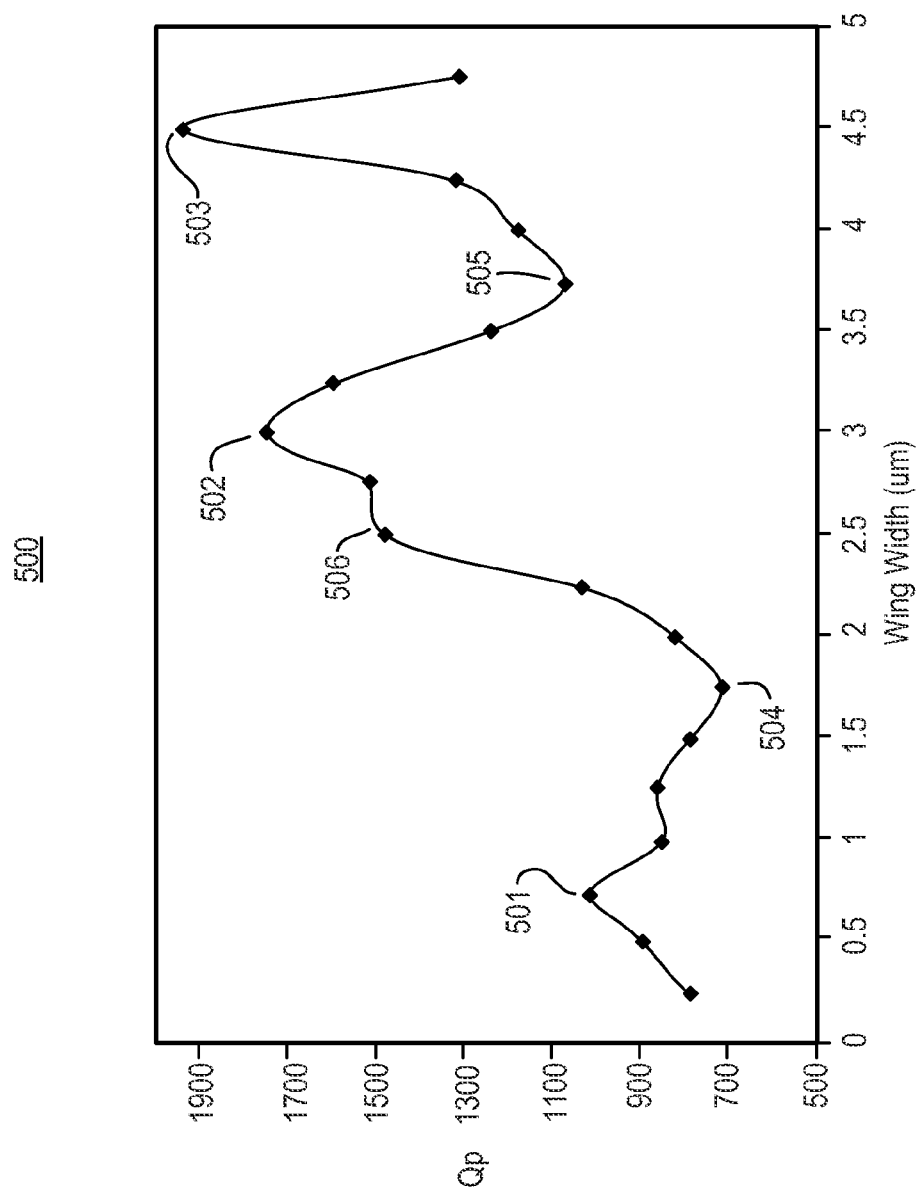
FIG. 5A shows a graph of the Q-factor at parallel resonance ($Q_p$) versus width of the cantilevered portion(s) of a bulk acoustic wave (BAW) resonator in accordance with a representative embodiment.

FIG. 5A shows a graph 500 of the Q-factor at parallel resonance (Qp) versus width (e.g., width 109, ('wing width')) of the cantilevered portion 106 of a bulk acoustic wave (BAW) resonator comprising a bridge (e.g., bulk acoustic wave (BAW) resonator 300) in accordance with a representative embodiment. The graph 500 provides data of a bulk acoustic wave (BAW) resonator comprising three cantilevered portions 106, such as illustratively shown in FIGS. 1A and 1B. The Q-factor is dependent on the wing width for a given parallel resonance frequency. As shown, there are relative maxima in $Q_p$ at points 501, 502 and 503; and relative minima at points 504 and 505 as the width 109 increases. Notably, $Q_p$ improves significantly at a certain width 109, compared with width=0 of the cantilevered portion 106, which is equivalent to a bulk acoustic wave (BAW) resonator having substantially the same configuration shown in FIG. 3A but without cantilevered portions 106.

The synergistic impact of the combination of the bridge 301 and the cantilevered portions 106 on Qp can be appreciated by a comparison of data in FIGS. 2A and 5A. For example, in an embodiment comprising cantilevered portion 106 having a width (e.g., width 109) of approximately 2.5 μm, Qp in FIG. 2A (near point 201, for example) is approximately 850. By contrast, an embodiment comprising bridge 301 and cantilevered portion 106 having a width of approximately 2.5 μm (e.g., near point 506) provides Qp of approximately 1500. Similarly, in an embodiment comprising cantilevered portion 106 having a width (e.g., width 109) of approximately 3.0 μm, Qp in FIG. 2A (near point 202, for example) is approximately 975. By contrast, an embodiment comprising bridge 301 and cantilevered portion 106 having a width of approximately 3.0 μm provides Qp of approximately 1750 (e.g., point 502 in FIG. 5A).

FIG. 5B shows a graph 507 of the Q-factor at series resonance ($Q_s$) versus width (e.g., width 109) of the cantilevered portion 106 of a bulk acoustic wave (BAW) resonator comprising a bridge (e.g., bulk acoustic wave (BAW) resonator 300) in accordance with a representative embodiment. The graph 507 provides data of a bulk acoustic wave (BAW) resonator comprising three cantilevered portions 106, such as illustratively shown in FIGS. 1A and 1B. The Q-factor is dependent on the wing width for a given series resonance frequency. As shown, there are relative maxima in Q, at points 508, 509 and 510; and relative minima at points 511, 512, 513 and 514 as the width 109 increases. Notably, $Q_s$ improves significantly at a certain width 109, compared with width=0 of the cantilevered portion 106, which is equivalent to a bulk acoustic wave (BAW) resonator having substantially the same configuration shown in FIG. 3 but without cantilevered portions 106. As noted previously, the impact of the bridge 301 on improved $Q_s$ is less dramatic than its impact on $Q_p$.

Figure 5C:
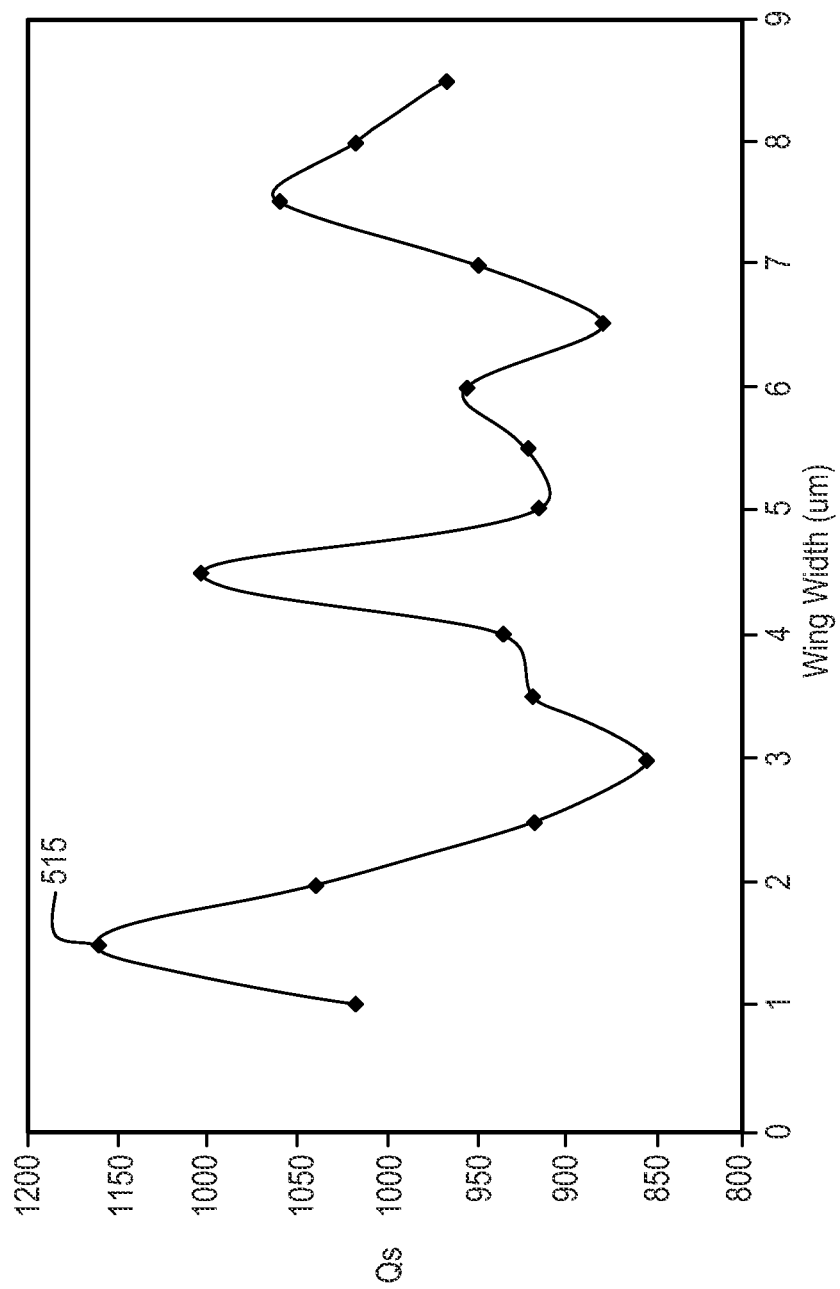
FIG. 5C shows a graph of the Q-factor at parallel resonance ($Q_p$) versus width of the cantilevered portion(s) of a bulk acoustic wave (BAW) resonator in accordance with a representative embodiment.

FIG. 5C shows a graph of the Q-factor at parallel resonance ($Q_p$) versus width of the cantilevered portion(s) of a bulk acoustic wave (BAW) resonator in accordance with a representative embodiment. As the total thickness of the acoustic stack decreases, the resonance frequency increases and, therefore, the acoustic wavelength at the resonance frequency decreases. An optimum width 109 ('wing width') of the cantilevered portion 106, at which the most Q enhancement is achieved, is determined by resonance acoustic quarter-wavelength, therefore smaller optimum wing width is required to achieve optimum Q. Notably, FIG. 5C relates to a bulk acoustic wave (BAW) resonator having a parallel resonance of 800 MHz. A maximum Q-value (shown at point 515) is attained at a wing width of approximately 1.6 μm.

Figure 6A:
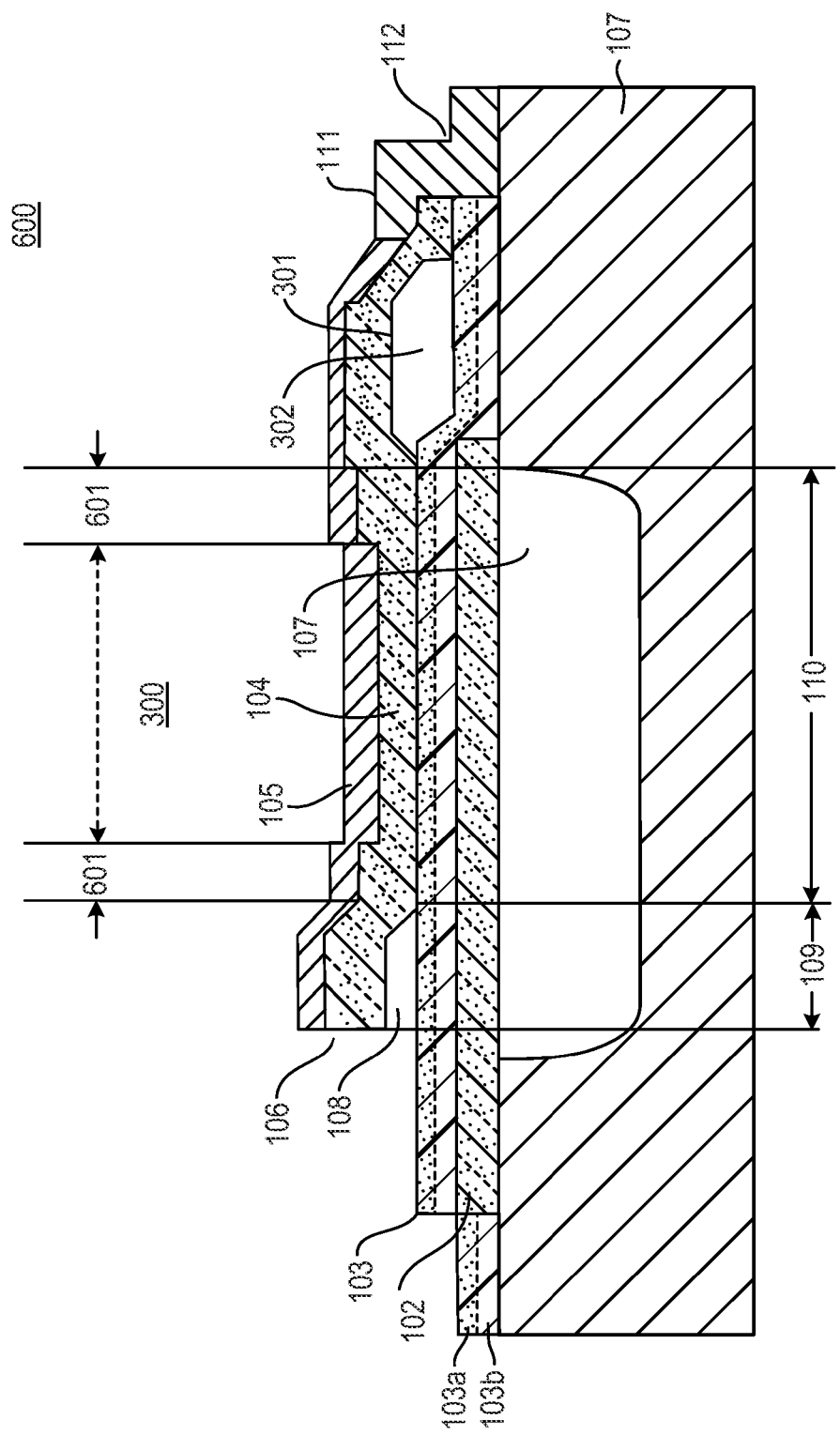
FIG. 6A shows a cross-sectional view of a bulk acoustic wave (BAW) resonator in accordance with a representative embodiment taken along line 5A-5A in FIG. 5B.
Figure 6B:
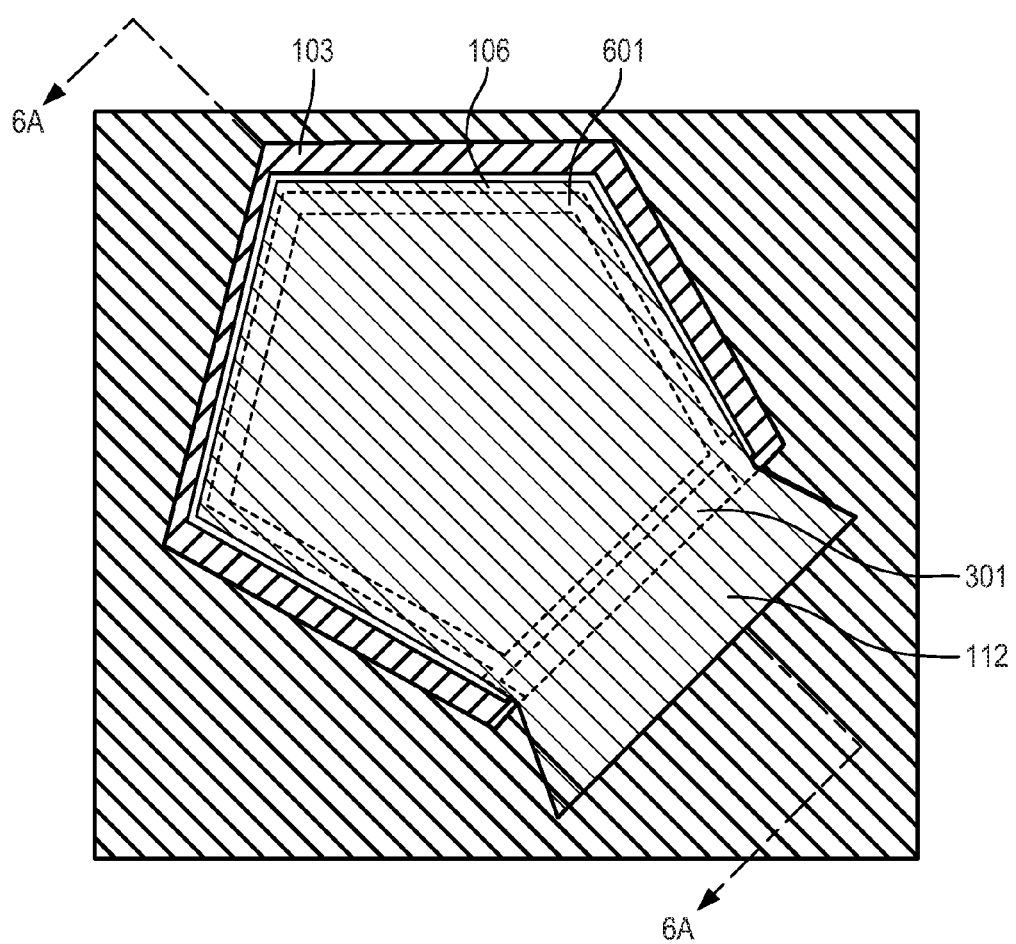
FIG. 6B shows a top view of a bulk acoustic wave (BAW) resonator in accordance with a representative embodiment.

FIG. 6A shows a cross-sectional view of a bulk acoustic wave (BAW) resonator 600 taken along line 6B-6B in accordance with a representative embodiment. FIG. 6B shows a top view of the bulk acoustic wave (BAW) resonator 600. Many of the features of the bulk acoustic wave (BAW) resonator 600 are common to those of bulk acoustic wave (BAW) resonators 100, 300, 304 described in connection with representative embodiments in FIGS. 1A-1B, 3A and 3B. Moreover, the piezoelectric layer 103 of the representative embodiment of FIG. 6A comprises piezoelectric layer 103 with first and second sub-layers 103A, 103B, or piezoelectric layer 408A, or piezoelectric layer 408B described above in connection with representative embodiments of FIGS. 3A-4B. The details of common features, characteristics and benefits thereof are not repeated in order to avoid obscuring the presently described embodiments.

The bulk acoustic wave (BAW) resonator 600 comprises the bridge 301 along the interconnection side 112. The bridge 301 provides the gap 302, which may be a void (e.g., air) or may be filled with a low acoustic impedance material. In addition to the bridge 301, the bulk acoustic wave (BAW) resonator 600 comprises a raised frame element 601 (commonly referred to as an 'outie'). The raised frame element 601 may be provided over one or more sides of the bulk acoustic wave (BAW) resonator 600 and provides an acoustic mismatch at the boundary of the second electrode 104, thereby improving signal reflections at the boundary and reducing acoustic losses. Ultimately, reduced losses translate into an improved Q-factor of the device. While the raised frame element 601 is shown disposed over the second electrode 104, these features may instead be provided over the first electrode 102 and beneath the piezoelectric layer 103, or selectively on both the first and second electrodes 102, 104. Further details of the use, formation and benefits of the raised frame element 601 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference.

The raised frame element 601 results in an increase in the parallel impedance (Rp) but generates spurious modes below the series resonance frequency; whereas the cantilevered portion 106 increases Rp without degrading Qs. This is because the area of the raised frame element 601 represents a comparatively small fraction of the active area of the bulk acoustic wave (BAW) resonator 600. It can be shown that this is equivalent to a bulk acoustic wave (BAW) resonator connected in parallel to a bulk acoustic wave (BAW) resonator comprising a frame element. Since the resonance frequency of a bulk acoustic wave (BAW) resonator comprising the raised frame element 601 is lower, spurious modes are generated below $f_s$ of the bulk acoustic wave (BAW) resonator without the frame element. The addition of the cantilevered portion 106 to the bulk acoustic wave (BAW) resonator 600 comprising the raised frame element 601 further increases Rp without resulting in additional spurious modes below $f_s$ because the cantilever 106 lies outside of the active area 110 of the bulk acoustic wave (BAW) resonator 600.

Figure 7:
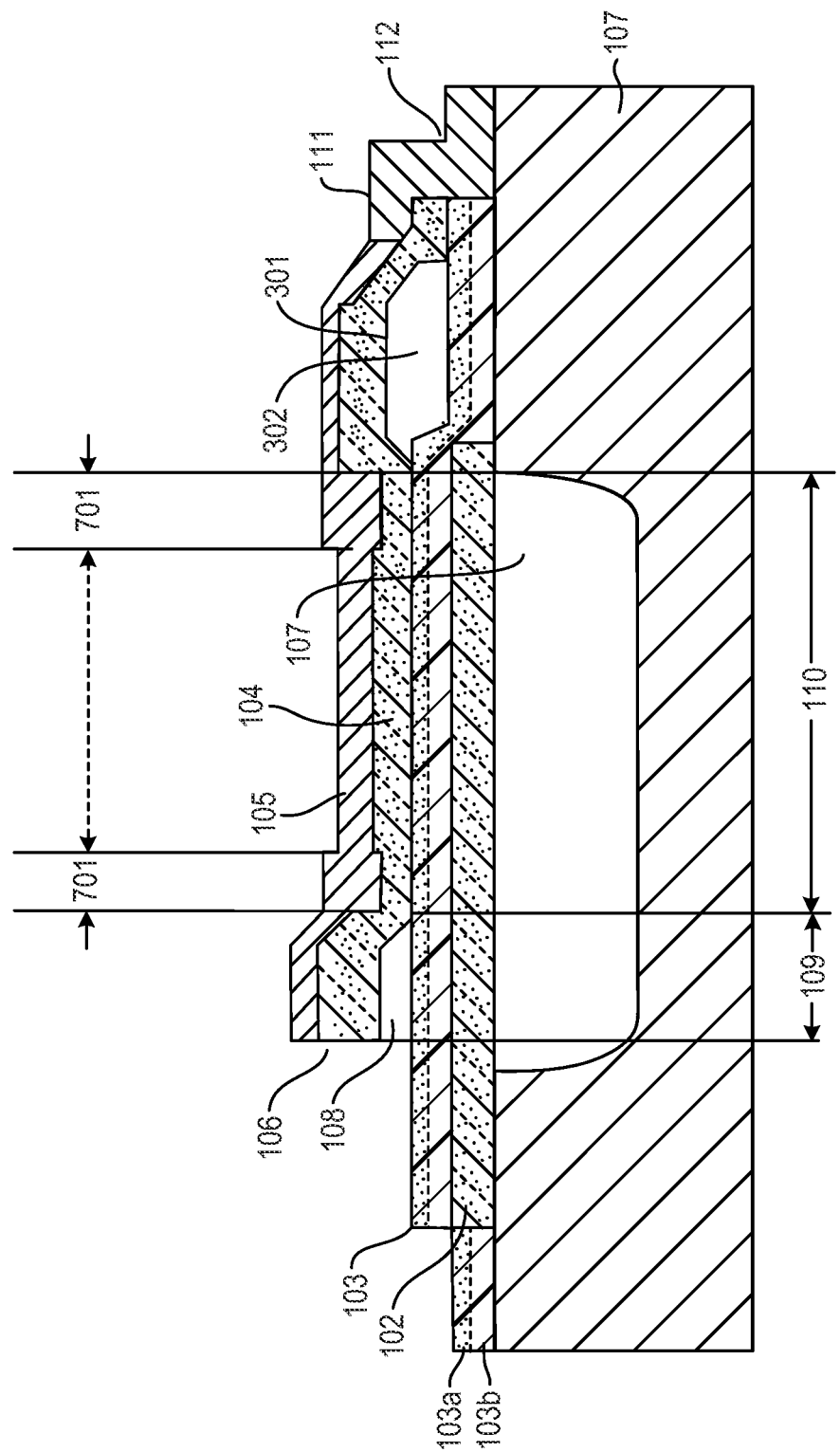
FIG. 7 shows a graph with traces depicting coupling coefficients of piezoelectric layers for purposes of comparison, in accordance with a representative embodiment.

FIG. 7 shows a cross-sectional view of a bulk acoustic wave (BAW) resonator 700 in accordance with a representative embodiment. Many of the features of the bulk acoustic wave (BAW) resonator 700 are common to those of bulk acoustic wave (BAW) resonators 100, 300, 304 and 600 described in connection with representative embodiments in FIGS. 1A-1B, 3A, 3B, 6A and 6B. Moreover, the piezoelectric layer 103 of the representative embodiment of FIG. 7 comprises first and second sub-layers 103A, 103B, or piezoelectric layer 408A, or piezoelectric layer 408B described above in connection with representative embodiments of FIGS. 3A-4B. The details of common features, characteristics and benefits thereof are not repeated in order to avoid obscuring the presently described embodiments.

The bulk acoustic wave (BAW) resonator 700 comprises the bridge 301 along the interconnection side 112. The bridge 301 provides the gap 302, which may be a void (e.g., air) or may be filled with a low acoustic impedance material. In addition to the bridge 301, the bulk acoustic wave (BAW) resonator 700 comprises a recessed frame element 701 ('innie'). The recessed frame element 701 may be disposed along one or more sides of the bulk acoustic wave (BAW) resonator 700 and provides an acoustic mismatch at the perimeter of the second electrode 104, thereby improving signal reflections and reducing acoustic losses. Ultimately, reduced losses translate into an improved Q-factor of the device. While the recessed frame element 701 is shown disposed over the second electrode 104, the recessed frame element 701 may instead be provided over the first electrode 102 and beneath the piezoelectric layer 103, or selectively on both the first and second electrodes 102, 104. Further details of the use, formation and benefits of the recessed frame element 701 may be found for example, in commonly owned U.S. Pat. No. 7,280,007 entitled "Thin Film Bulk Acoustic Resonator with a Mass Loaded Perimeter" to Feng, et al.; and commonly owned U.S. Patent Application Publication 20070205850 entitled "Piezoelectric Resonator Structure and Electronic Filters having Frame Elements" to Jamneala, et al. The disclosures of this patent and patent application publication are specifically incorporated herein by reference. Moreover, the incorporation of both a raised frame element (e.g., raised frame element 601) and a recessed frame (e.g., recessed frame element 701) in a bulk acoustic wave (BAW) resonator 700 is also contemplated by the present teachings. The incorporation of both raised and recessed frame elements in a bulk acoustic wave (BAW) resonator is disclosed in the parent application (U.S. patent application Ser. No. 12/490,525).

Figure 8:
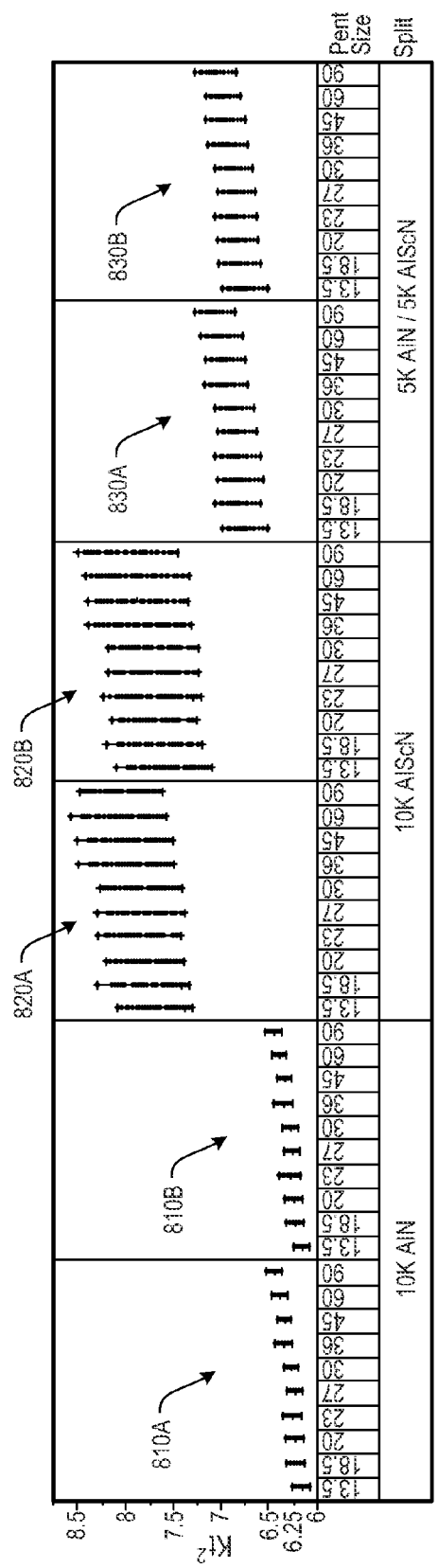
FIG. 8 is a graph showing traces depicting coupling coefficients of piezoelectric layers with variations in doping, in accordance with a representative embodiment.

FIG. 8 is a graph showing traces depicting coupling coefficients of piezoelectric layers with variations in doping, in accordance with a representative embodiment.

Referring to FIG. 8, six sets of traces are shown for purposes of comparison corresponding to six sets of samples. "PentSize" refers to the size, in square microns, of the pentagon shaped resonator of each sample (e.g., as shown in FIG. 6B), and "Split" refers to the construction of piezoelectric layers or sub-layers of each set of samples. Notably, the six sample sets are grouped into three pairs of traces, where the samples in each pair have substantially the same construction and are tested under substantially the same conditions in order to establish repeatability. The first pair includes trace sets 810A and 810B, in which the sample resonators have piezoelectric layers formed entirely of a single layer of undoped AlN having a thickness of about 10,000 Å. The second pair includes trace sets 820A and 820B, in which the resonators have piezoelectric layers formed entirely of a single layer of AlN doped with Sc (AlScN) having a thickness of about 10,000 Å. The third pair includes trace sets 830A and 830B, in which the resonators have piezoelectric layers formed of a sub-layer of undoped AlN having a thickness of about 5,000 Å and a sub-layer of doped AlScN having a thickness of about 5,000 Å.

Trace sets 810A and 810B show coupling coefficients $kt^2$ for a piezoelectric layer formed entirely of undoped AlN material ranging from about 6.1 to about 6.5, with the larger samples being slightly higher. Trace sets 820A and 820B show coupling coefficients $kt^2$ for a piezoelectric layer formed entirely of AlN material doped with approximately 2.5 atomic percent Sc ranging from about 7.2 to about 8.5, with the larger samples being slightly higher. Trace sets 830A and 830B show coupling coefficient $kt^2$ for a piezoelectric layer having a first sub-layer formed of undoped AlN material and a second sub-layer formed of AlN material doped with approximately the same atomic percent Sc, according to a representative embodiment, ranging from about 6.5 to about 7.2, with the larger samples being slightly higher.

As compared to trace sets 810A/810B, trace sets 820A/820B and trace sets 830A/830B show improvement in electrical performance of the piezoelectric layer from the perspective of increased absolute value distributions of the coupling coefficient $kt^2$ due to doping the AlN material with Sc. Indeed, trace sets 820A/820B show that the highest increase in coupling coefficient $kt^2$ is achieved using the piezoelectric layer formed entirely of the doped AlN material. However, trace sets 820A/820B also show the largest variation in coupling coefficient $kt^2$ values across the wafer (indicated by the length of each trace), having a spread of approximately 1 percent, which results from the increased stress levels caused by doping. In comparison, trace sets 830A/830B show about a 50 percent reduction in coupling coefficient $kt^2$ variation across the wafer, having a spread of only about 0.5 percent, while still providing appreciable improvement in absolute value distributions of the coupling coefficient $kt^2$ over the piezoelectric material formed only of undoped AlN, shown by trace sets 810A/810B. Accordingly, the piezoelectric layer consisting of both undoped and doped portions of AlN material, via multiple sub-layers (e.g., FIGS. 3B and 4A) or by varying doping amounts within a single layer (e.g., FIG. 4B), provides a desirable balance between increased coupling coefficient $kt^2$ and consistency across the wafer.

Figure 9:
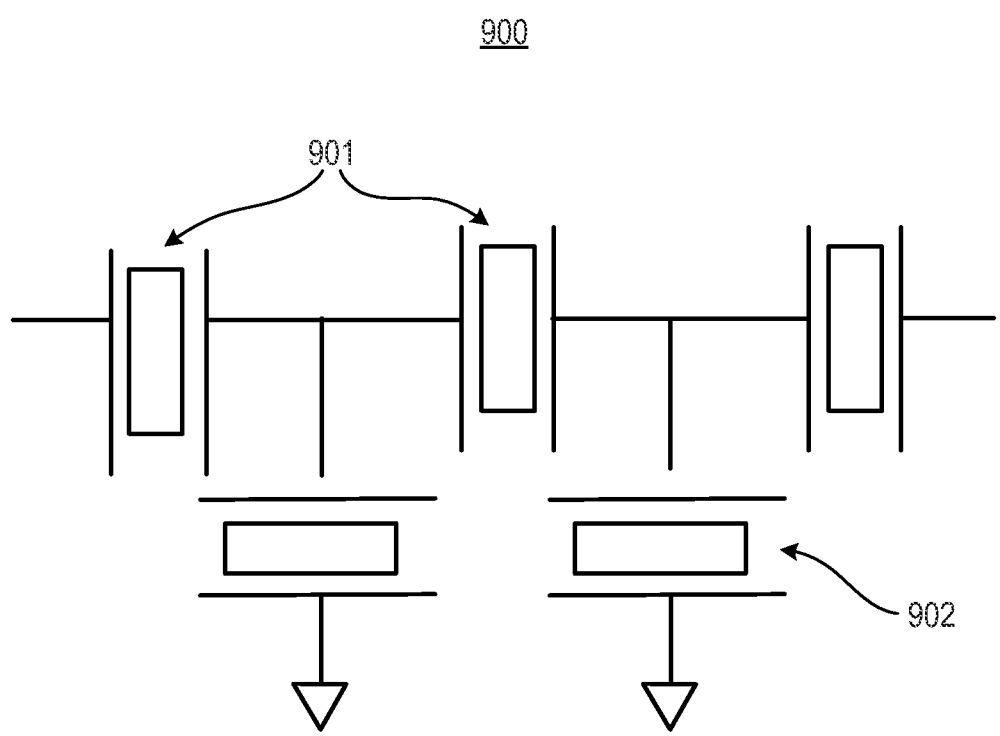
FIG. 9 shows a simplified schematic block diagram of an electrical filter 900 in accordance with a representative embodiment.

When connected in a selected topology, a plurality of bulk acoustic wave (BAW) resonators 100, 300, 304, 600 and 700 can function as an electrical filter. FIG. 9 shows a simplified schematic block diagram of an electrical filter 900 in accordance with a representative embodiment. The electrical filter 900 comprises series bulk acoustic wave (BAW) resonators 901 and shunt bulk acoustic wave (BAW) resonators 902. The series resonators 901 and shunt resonators 902 may comprise the bulk acoustic wave (BAW) resonators 100, 300, 304, 600 and 700 described in connection with the representative embodiments of FIGS. 1A, 1B, 3A, 3B, 6A, 6B and 7. The electrical filter 900 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 800 is merely illustrative and other topologies are contemplated. Moreover, the bulk acoustic wave (BAW) resonators of the representative embodiments are contemplated in a variety of applications besides duplexers.

In alternative embodiments, piezoelectric layers doped with two or more rare earth elements may be formed in resonator stacks of various other types of resonator devices, without departing from the scope of the present teachings. For example, a piezoelectric layer doped with two or more rare earth elements may be formed in resonator stacks of a stacked bulk acoustic resonator (SBAR) device, a double bulk acoustic resonator (DBAR) device, or a coupled resonator filter (CRF) device.

Notably, piezoelectric layers consisting of both undoped and doped portions of piezoelectric material have been discussed herein with reference to BAW resonator devices, including FBARs and SMRs, as examples. However, it is understood that such piezoelectric layers may be formed in resonator stacks of various other types of resonator devices, without departing from the scope of the present teachings. For example, piezoelectric layers consisting of undoped and doped portions of piezoelectric material may be formed in resonator stacks of a stacked bulk acoustic resonator (SBAR) device, a double bulk acoustic resonator (DBAR) device, or a coupled resonator filter (CRF) device.

In accordance with illustrative embodiments, bulk acoustic wave (BAW) resonators for various applications such as in electrical filters are described having an electrode comprising a cantilevered portion. Additionally, bulk acoustic wave (BAW) resonators for various applications such as in electrical filters are described having an electrode comprising a cantilevered portion and a bridge. One of ordinary skill in the art appreciates that many variations that are in accordance with the present teachings are possible and remain within the scope of the appended claims. These and other variations would become clear to one of ordinary skill in the art after inspection of the specification, drawings and claims herein. The invention therefore is not to be restricted except within the spirit and scope of the appended claims.

We claim:

1. A bulk acoustic wave (BAW) resonator, comprising:
    a first electrode;
    a second electrode comprising a plurality of sides, wherein at least one of the sides comprises a cantilevered portion;
    a piezoelectric layer comprising aluminum nitride (AlN) and disposed between the first and second electrodes, the piezoelectric layer comprising undoped piezoelectric material and doped piezoelectric material, the doped piezoelectric material being doped with at least one rare earth element in a range of approximately 30 atomic percent to approximately 40 atomic percent of the doped piezoelectric material; and
    a gap between the cantilevered portion and the piezoelectric layer.

2. A bulk acoustic wave (BAW) resonator as claimed in claim 1, wherein the at least one rare earth element comprises at least one of scandium (Sc) and yttrium (Y).

3. A bulk acoustic wave (BAW) resonator as claimed in claim 1, wherein a concentration of another one of the at least one rare earth elements is less than approximately 10 atomic percent of the doped piezoelectric material.

4. A bulk acoustic wave (BAW) resonator as claimed in claim 1, wherein the piezoelectric layer comprises an undoped sub-layer formed of the undoped piezoelectric material and a doped sub-layer formed of the doped piezoelectric material.

5. A bulk acoustic wave (BAW) resonator as claimed in claim 4, wherein the doped sub-layer is formed on the undoped sub-layer.

6. A bulk acoustic wave (BAW) resonator as claimed in claim 4, wherein the undoped sub-layer is formed on the doped sub-layer.

7. A bulk acoustic wave (BAW) resonator as claimed in claim 1, wherein the piezoelectric layer comprises an undoped sub-layer formed of the undoped piezoelectric material and a plurality of doped sub-layers formed of the doped piezoelectric material having different atomic percentages of the at least one rare earth element, respectively.

8. A bulk acoustic wave (BAW) resonator as claimed in claim 7, wherein the plurality of doped sub-layers have incrementally decreasing atomic percentages of the at least one rare earth element.

9. A bulk acoustic wave (BAW) resonator as claimed in claim 1, wherein the piezoelectric layer comprises a single layer comprising the undoped piezoelectric material and the doped piezoelectric material, and the doped piezoelectric material is variously doped at varying atomic percentages of the at least one rare earth element over a thickness of the piezoelectric layer, at least a portion of the variously doped piezoelectric material being undoped.

10. A bulk acoustic wave (BAW) resonator as claimed in claim 9, wherein the variously doped piezoelectric material includes incrementally increasing atomic percentages of the at least one rare earth element away from the substrate over the thickness of the piezoelectric layer.

11. A bulk acoustic wave (BAW) resonator as claimed in claim 9, wherein the variously doped piezoelectric material includes incrementally decreasing atomic percentages of the at least one rare earth element away from the substrate over the thickness of the piezoelectric layer.

12. A bulk acoustic wave (BAW) resonator as claimed in claim 1, further comprising a reflective element disposed beneath the first electrode, the second electrode and the piezoelectric layer, wherein a contacting overlap of the reflective element, the first electrode, the second electrode and the piezoelectric layer defines an active area of the acoustic resonator.

13. A bulk acoustic wave (BAW) resonator as claimed in claim 12, wherein the cantilevered portion of the second electrode extends beyond a termination of the active area.

14. A bulk acoustic wave (BAW) resonator as claimed in claim 12, further comprising a bridge adjacent to a termination of the active area of the acoustic resonator.

15. A bulk acoustic wave (BAW) resonator as claimed in claim 14, wherein the gap is a first gap, and the bridge comprises a second gap, which exists in a region between the second electrode and the piezoelectric layer.

16. A bulk acoustic wave (BAW) resonator as claimed in claim 1, further comprising a frame element.

17. A bulk acoustic wave (BAW) resonator as claimed in claim 16, wherein the frame element is a recessed frame element.

18. A bulk acoustic wave (BAW) resonator as claimed in claim 16, wherein the frame element comprises a raised frame element.

19. A bulk acoustic wave (BAW) resonator as claimed in claim 1, wherein all but one of the plurality of sides of the second electrode comprises the cantilevered portion.

20. A bulk acoustic wave (BAW) resonator as claimed in claim 19, further comprising an electrical connection to the one of the plurality of sides of the second electrode that does not comprise a cantilevered portion.

21. A bulk acoustic wave (BAW) resonator, comprising:
a first electrode;
a second electrode comprising a plurality of sides, wherein at least one of the sides comprises a cantilevered portion;
a piezoelectric layer disposed between the first and second electrodes, the piezoelectric layer comprising undoped piezoelectric material and doped piezoelectric material, the doped piezoelectric material being doped with at least one of scandium (Sc) and Yttrium (Y) having a concentration in a range of approximately 30 atomic percent to approximately 40 atomic percent of the doped piezoelectric material, wherein the cantilevered portion extends above the piezoelectric layer;
a reflective element disposed beneath the first electrode, the second electrode and the piezoelectric layer, a contacting overlap of the reflective element, the first electrode, the second electrode and the piezoelectric layer defining an active area of the acoustic resonator, wherein the first electrode substantially covers the reflective element, and the piezoelectric layer extends over an edge of the first electrode; and
a bridge disposed adjacent to a termination of the active area of the acoustic resonator, the bridge extending past an edge of the reflective element.

22. A bulk acoustic wave (BAW) resonator as claimed in claim 21, wherein the cantilevered portion of the second electrode extends beyond a termination of the active area.

23. A bulk acoustic wave (BAW) resonator as claimed in claim 21, further comprising a frame element.

24. A bulk acoustic wave (BAW) resonator as claimed in claim 23, wherein the frame element is a recessed frame element.

25. A bulk acoustic wave (BAW) resonator as claimed in claim 23, wherein the frame element comprises a raised frame element.

26. A bulk acoustic wave (BAW) resonator as claimed in claim 21, wherein the bridge comprises a gap, and the gap exists in a region between the second electrode and the piezoelectric layer.

27. A bulk acoustic wave (BAW) resonator as claimed in claim 21, wherein all but one of the plurality of sides of the second electrode comprise the cantilevered portion.

28. A bulk acoustic wave (BAW) resonator as claimed in claim 21, wherein the piezoelectric material comprises aluminum nitride (AlN).

29. A bulk acoustic wave (BAW) resonator as claimed in claim 21, wherein a concentration of the other of Sc or Y is less than approximately 10 atomic percent of the doped piezoelectric material.

30. A bulk acoustic wave (BAW) resonator as claimed in claim 21, wherein the piezoelectric layer comprises an undoped sub-layer formed of undoped piezoelectric material and a doped sub-layer formed of doped piezoelectric material.

31. A bulk acoustic wave (BAW) resonator as claimed in claim 30, wherein the doped sub-layer is formed on the undoped sub-layer.

32. A bulk acoustic wave (BAW) resonator as claimed in claim 30, wherein the undoped sub-layer is formed on the doped sub-layer.

33. A bulk acoustic wave (BAW) resonator as claimed in claim 21, wherein the piezoelectric layer comprises an undoped sub-layer formed of the undoped piezoelectric material and a plurality of doped sub-layers formed of the doped piezoelectric material having different atomic percentages of the at least one rare earth element, respectively.

34. A bulk acoustic wave (BAW) resonator as claimed in claim 33, wherein the plurality of the doped sub-layers have incrementally increasing atomic percentages of the at least one rare earth element away from the substrate.

35. A bulk acoustic wave (BAW) resonator as claimed in claim 33, wherein the plurality of doped sub-layers have incrementally decreasing atomic percentages of the at least one rare earth element away from the substrate.

36. A bulk acoustic wave (BAW) resonator as claimed in claim 21, wherein the piezoelectric layer comprises a single layer comprising the undoped piezoelectric material and the doped piezoelectric material, and the doped piezoelectric material is variously doped at varying atomic percentages of the at least one rare earth element over a thickness of the piezoelectric layer, at least a portion of the variously doped piezoelectric material being undoped.

37. A bulk acoustic wave (BAW) resonator as claimed in claim 36, wherein the variously doped piezoelectric material includes incrementally increasing atomic percentages of the at least one rare earth element over the thickness of the piezoelectric layer away from the substrate.

38. A bulk acoustic wave (BAW) resonator as claimed in claim 36, wherein the variously doped piezoelectric material includes incrementally decreasing atomic percentages of the at least one rare earth element over the thickness of the piezoelectric layer away from the substrate.

* * * * *